United States Patent [19]
Kimoto et al.

[11] Patent Number: 5,546,496
[45] Date of Patent: Aug. 13, 1996

[54] LIGHT EMITTING DISPLAY DEVICE HAVING LIGHT RECEIVING ELEMENT FOR RECEIVING LIGHT FROM LIGHT EMITTING ELEMENT AND SELF-HOLDING AND OPTICAL PASSAGE FOR GUIDING DRIVE LIGHT TO THE LIGHT RECEIVING ELEMENT

[75] Inventors: Masahiko Kimoto, Ikoma; Masumi Nakamichi, Tenri; Takahiro Funakoshi, Tenri; Yasuhiro Wada, Tenri; Takehiro Yamamoto, Hirakata; Yoichi Tsuda, Tenri, all of Japan

[73] Assignee: Sharp Kabushiki Kaisha, Osaka, Japan

[21] Appl. No.: 418,756

[22] Filed: Apr. 7, 1995

[30] Foreign Application Priority Data

| Apr. 8, 1994 | [JP] | Japan | 6-070518 |
| Sep. 14, 1994 | [JP] | Japan | 6-219847 |

[51] Int. Cl.⁶ ............................................ G02B 6/34
[52] U.S. Cl. .............. 385/146; 250/201.1; 250/553; 250/227.11; 257/80; 385/15; 385/24
[58] Field of Search ........................... 385/15, 17, 24, 385/129, 130, 132, 133, 146, 147; 250/201.1, 553, 559.01, 559.19, 559.29, 206, 215, 227.11, 229, 231.11, 230, 578.1; 257/80–85; 356/317, 318

[56] References Cited

U.S. PATENT DOCUMENTS

| Re. 33,422 | 11/1990 | Garcia, Jr. | 250/229 |
| 4,084,905 | 4/1978 | Schreiber et al. | 356/317 |
| 5,321,294 | 6/1994 | Chino et al. | 257/85 |
| 5,365,383 | 11/1994 | Miller et al. | 250/559.29 X |

FOREIGN PATENT DOCUMENTS

| 60-201679 | 10/1985 | Japan . |
| 62-45187 | 2/1987 | Japan . |

*Primary Examiner*—John D. Lee
*Attorney, Agent, or Firm*—David G. Conlin; Brian L. Michaelis

[57] ABSTRACT

There is provided an inexpensive light emitting display device which has a simple wiring structure and produces a bright screen display. A photo-transistor is connected in series with a light emitting diode. The photo-transistor is arranged so that light emitted from the light emitting diode enters into the photo-transistor. There is provided an optical guide for guiding a data signal light to the photo-transistor and an optical guide for guiding a scanning signal light to the phototransistor. Further, an optical control section has a laser diode array, a lens array, and a deflection mirror. The above-mentioned arrangement obviates the need of an electric wiring for a data signal and a scanning signal, and is able to turn on the photo-transistor with the emission light from the light emitting diode and makes the photo-transistor self-hold its conductive state.

30 Claims, 25 Drawing Sheets

Fig. 30
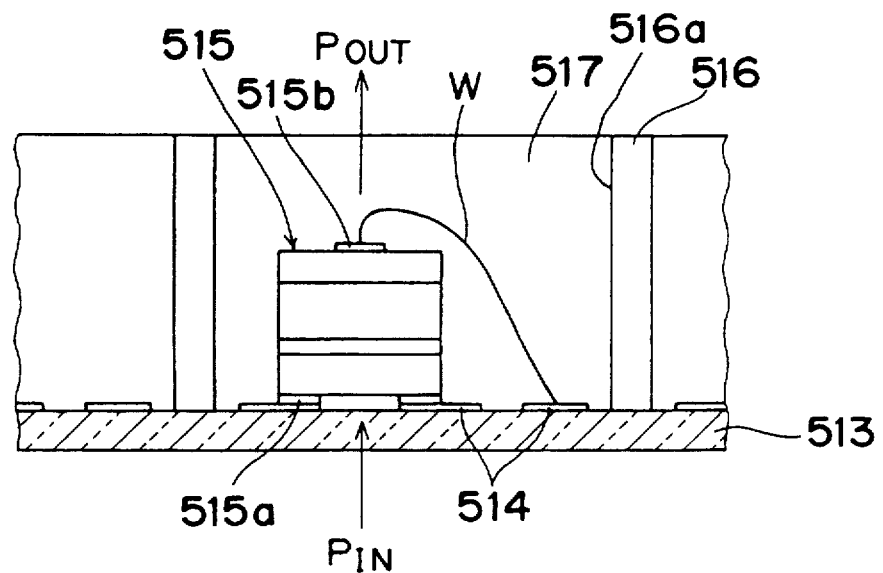
Fig. 31A
Fig. 31B
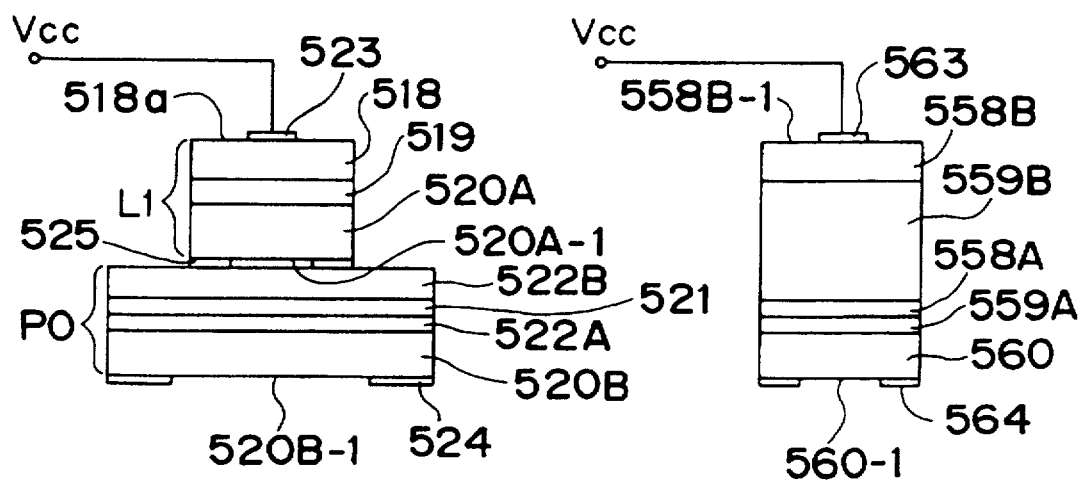

LIGHT EMITTING DISPLAY DEVICE HAVING LIGHT RECEIVING ELEMENT FOR RECEIVING LIGHT FROM LIGHT EMITTING ELEMENT AND SELF-HOLDING AND OPTICAL PASSAGE FOR GUIDING DRIVE LIGHT TO THE LIGHT RECEIVING ELEMENT

BACKGROUND OF THE INVENTION

1. Field of the Invention

The present invention relates to a light emitting display device for use in an LED (light emitting diode) display panel, and in particular, to an inexpensive bright light emitting display device.

2. Description of the Prior Art

Conventionally, as driving methods of a light emitting display device, two types of a static drive type and a dynamic drive type have been put into practical use.

FIG. 33 is a block diagram of a static drive type light emitting display device, while FIG. 35 is a circuit diagram of a static drive type LED dot matrix section.

As shown in FIG. 33, the static drive type light emitting display device has a shift register 216, a latch circuit 217, a driver section 218, and an LED dot matrix section 219. Each LED of the LED dot matrix section 219 is connected to each driver of the driver section 218 one by one.

In the static drive type light emitting display device, serial image signals are successively transmitted to the shift register 216. When the shift register 216 takes in image signals of one screen, the image signals are transmitted from the shift register 216 to the latch circuit 217. The latch circuit 217 drives the driver section 218, with which the driver section 218 lights the LED dot matrix section 219.

The static drive type light emitting display device can continue to light for one screen from a time when the device starts to light the screen to a time when the device takes in a signal of the next screen and starts to display the next screen.

FIG. 34 is a block diagram of a dynamic drive type light emitting display device, while FIG. 36 is a circuit diagram of a dynamic drive type LED dot matrix section.

As shown in FIG. 34, the dynamic drive type light emitting display device comprises a shift register 316, a latch circuit 317, a decoder 320, a driver section 318, and an LED dot matrix section 319.

In the dynamic drive type light emitting display device, serial image signals are successively transmitted to the shift register 316. When the shift register 316 takes in signals of one line, the signals of the one line are transmitted from the shift register 316 to the latch circuit 317. Then, the latch circuit 317 outputs the signals of the one line to the driver section 318 to drive the driver section 318. In the above-mentioned time, an address signal synchronized with the image signal is inputted to the decoder 320. Then, the decoder 320 drives a driver in a driver section 321 for a line corresponding to the image signals, and the driver lights an LED dot matrix section 322. The LED dot matrix section 322 continues to light to a time when the shift register 316 completely takes in signals of the next line and then the driver sections 318 and 321 light the LED dot matrix section 322 with the signals of the next line. In other words, the dynamic drive type light emitting display device performs a dynamic lighting of time-sharingly lighting the LEDs every line. Normally, the dynamic drive type light emitting display device lights the LEDs at a duty ratio of $1/16$ or a duty ratio of $1/8$.

The static drive type light emitting display device can light the LEDs during an interval of displaying one screen, and therefore the device can provide a bright screen display. However, the static drive type light emitting display device requires drivers corresponding in number to the number of dots of the LEDs had by the LED dot matrix section 322, and further requires a one-to-one connection between each LED and each driver. Furthermore, in order to effect a multi-color light emitting display, the numbers of wiring lines and drivers are required to be doubled or trebled. Therefore, the above-mentioned arrangement results in a complicated wiring for the connection between the LEDs and the drivers together with an increased cost.

On the other hand, in the dynamic drive type light emitting display device, signals are transmitted every scanning line, and therefore the drivers and wiring lines can be reduced in number as compared with the static drive type. However, since one screen is displayed by time-sharingly lighting the LEDs, an average luminance of one LED dot is disadvantageously reduced by some degree attributed to the time-sharing lighting.

Although the drivers and the wiring lines are remarkably reduced in number as compared with the static drive type, for the reason that data signal lines and scanning signal lines are connected to the anodes and the cathodes of the LEDs in an intersecting manner, it is required to wire the signal lines by means of a substrate having a multi-layer structure, disadvantageously resulting in a complicated wiring structure. Furthermore, in order to effect the multi-color light emitting, the wiring lines and the drivers increase in number as compared with a case of a single-color light emitting, resulting in a further complicated wiring structure.

SUMMARY OF THE INVENTION

The object of the present invention is therefore to provide an inexpensive light emitting display device which has a simple wiring structure and produces a bright screen display.

In order to achieve the aforementioned object, there is provided a light emitting display device comprising: a light emitting element; a light receiving element which is electrically connected in series with the light emitting element so that the light emitting element is driven to emit light when the light receiving element becomes conductive, and is arranged so that the light receiving element can be made conductive upon receiving light emitted from the light emitting element on a light receiving surface of the light receiving element; and an optical passage which guides both drive lights of a data light representing data and a scanning light to the light receiving element to make the light receiving element conductive.

According to the above-mentioned arrangement, both the drive lights of the data light representing data and the scanning light are guided through the optical passage to each light receiving element. The light receiving element becomes conductive upon receiving both the drive lights. Then, the power source is conducted to the light emitting element, with which the light emitting element is driven to emit light. Then, the light emitted from the light emitting element enters into the light receiving element.

Thus the light emitting element is driven by guiding the data light and the scanning light to the light receiving element by way of the optical passage, which obviates the need of any electric wiring for conducting the data signal and the scanning signal to the light emitting element. Therefore, the necessitated electric wiring to the display section is allowed to be only the electric wiring for supplying the electric power, which allows the electric wiring structure to be simplified.

Furthermore, by making the light emitted from the light emitting element enter into the light receiving element, the light receiving element can be made conductive by the light emitted from the light emitting element even after the drive light stops entering into the light receiving element. In other words, the light receiving element can self-hold its conductive state. Therefore, the light emitting time of the light emitting element can be increased to allow a bright display equivalent to that of the static drive type to be achieved.

In a preferred embodiment, there is a drive light output means outputting a drive light having a wavelength different from a wavelength of display light emitted from the light emitting element.

In the present case, the drive light has a wavelength different from the wavelength of the display light emitted from the light emitting element. Therefore, even through the drive light leaks from the optical passage and is mixed with the display light, the display is not disturbed.

According to a preferred embodiment, each of the drive lights is infra-red light.

In the present case, the above-mentioned drive light is infra-red light, and therefore the drive light emitting means for generating the drive light is allowed to be an infra-red light emitting element. Therefore, the drive light emitting means for generating the drive light can be made inexpensive.

According to a preferred embodiment, the light receiving element has a mask for interrupting external light directed to the light receiving surface.

In the present case, the light receiving element has the mask for interrupting the external light directed to the light receiving surface. Therefore, the light receiving element can be prevented from being conductive due to the external light, and the possible erroneous operation of the light receiving element can be prevented.

According to a preferred embodiment, the mask constitutes an electrode of the light receiving element.

In the present case, the electrode of the light receiving element concurrently serves as the mask. Therefore, the possible erroneous operation of the light receiving element can be prevented with the simple structure.

According to a preferred embodiment, there is provided a filter for removing the drive light for making the light receiving element conductive from the external light directed to the light receiving element.

With the above-mentioned arrangement, the light receiving element can be prevented from being conductive due to the external light, with which the possible erroneous operation of the light receiving element can be prevented.

According to a preferred embodiment, the optical passage is a grating-shaped optical guide which has a data optical passage for guiding the data light and a scanning optical passage for guiding the scanning light, said data optical passage and said scanning optical passage crossing each other in an identical plane.

In the present case, the optical passage is the grating-shaped optical guide. Therefore, the drive light can be taken out at the intersection of the grating and made to enter into the light receiving element.

According to a preferred embodiment, the grating-shaped optical guide has a quadrangular pyramid-shaped optical reflector which is arranged at an intersection of the grating-shaped optical guide, and operates to reflect the data light and the scanning light in a direction perpendicular to a plane along the optical guide to direct the lights to the light receiving surface of the light receiving element.

In the above-mentioned preferred embodiment, the grating-shaped optical guide has the quadrangular pyramid-shaped light reflector at the intersection. Therefore, the drive light can be reflected on the light reflector, perpendicularly guided from the optical guide plane, and then guided to the light receiving surface of the light receiving element.

According to a preferred embodiment, the optical passage has a data optical passage for guiding the data light and a scanning optical passage for guiding the scanning light, and one of the data optical passage and the scanning optical passage has an extension which extends from a portion adjacent to an intersection of the data optical passage and the scanning optical passage to a proximity of the other of the data optical passage and the scanning optical passage.

In the above-mentioned preferred embodiment, the optical passage is separated to be provided in the form of the data optical passage and the scanning optical passage. Therefore, the data light and the scanning light can be prevented from being mixed with each other.

According to a preferred embodiment, the data optical passage is provided with a trigonal prism-shaped reflector which is arranged at a portion adjacent to the intersection, and has an inclined reflection surface for reflecting the data light in a direction perpendicular to the data optical passage and the scanning optical passage, and the scanning optical passage is provided with a trigonal prism-shaped reflector which is arranged at a portion adjacent to the intersection, and has an inclined reflection surface for reflecting the scanning light in a direction perpendicular to the data optical passage and the scanning optical passage.

In the above-mentioned preferred embodiment, the data optical passage and the scanning optical passage are each provided with a trigonal prism-shaped reflector in a portion adjacent to the intersection of them. Therefore, the data light and the scanning light can be reflected on the reflector in a direction perpendicular to the optical passage plane, and then made to enter into the light receiving surface of the light receiving element.

A light emitting display device according to a preferred embodiment comprises a light receiving element; and a light emitting element which is electrically connected in series with the light receiving element and has a bottom surface fixed to the light receiving element, wherein light emitted from a side surface of the light emitting element enters into a light receiving surface which is not facing the bottom surface of the light emitting element and is a part of an upper surface of the light receiving element to make the light receiving element conductive.

In the above-mentioned preferred embodiment, the light emitted from the side surface of the light emitting element fixed on the light receiving element can be made to enter into the light receiving surface of the upper surface of the light receiving element.

A light emitting display device according to a preferred embodiment comprises a light receiving element; a light emitting element which is electrically connected in series with the light receiving element and has a bottom surface fixed to the light receiving element, wherein light emitted from a side surface of the light emitting element enters into a light receiving surface which is not facing the bottom surface of the light emitting element and is a part of an upper surface of the light receiving element to make the light receiving element conductive; and an optical passage which has an extension which is arranged adjacent to the light receiving element and extends upward from below the light receiving element, and operates to reflect a drive light which travels upward through the extension at an upper end of the extension to make the drive light enter into the light receiving surface of the light receiving element.

In the above-mentioned preferred embodiment, light emitted from the side surface of the light emitting element fixed on the light receiving element can be made to enter into the light receiving surface of the upper surface of the light receiving element, while the drive light can be reflected on an upper end of the extension of the optical passage extending upward beside the light receiving element, and then made to enter into the light receiving surface at the upper surface of the light receiving element.

A light emitting display device according to a preferred embodiment comprises a plurality of light emitting elements which output lights having different wavelengths; a light receiving element which is connected in series with each of the plural number of light emitting elements, and becomes conductive upon receiving light having a wavelength corresponding to each color of the lights emitted from the light emitting elements; an optical passage which transmits both of each of data lights representing data of the plural number of wavelengths corresponding to the plural number of different colors of lights and a scanning light, and guides both the lights to the light receiving element; and a color filter which is provided between the optical passage and the light receiving element, and allows only light for making each of the light emitting elements conductive to pass through the color filter.

In the above-mentioned preferred embodiment, there are provided the plural number of light emitting elements having emission lights of different colors and the light receiving element which becomes conductive upon receiving the light having a wavelength corresponding to the emission color of each of the light emitting elements. The optical passage transmits both the drive lights of the data light representing data of a plurality of different wavelengths and the scanning light, and the color filter provided between the optical passage and each light receiving element allows only the light having the wavelength for making conductive the light receiving element to pass. Therefore, a color display can be achieved.

A light emitting display device according to a preferred embodiment comprises a light emitting element; a light receiving element which is electrically connected in series with the light emitting element so that the light receiving element drives the light emitting element to make the light emitting element emit light when the light receiving element becomes conductive, and is arranged so that the light receiving element becomes conductive upon receiving light emitted from the light emitting element, and which becomes conductive upon receiving both drive signals of a data signal and a scanning signal; an optical passage which guides a light signal representing one of the data signal and the scanning signal; and an electric passage which conducts an electric signal representing the other of the data signal and the scanning signal to the light receiving element.

In the above-mentioned preferred embodiment, the optical passage guides the light signal representing either one of the data signal and the scanning signal to the light receiving element, while the electrical passage conducts the electric signal representing the other one of the data signal and the scanning signal to the light receiving element. Therefore, the light receiving element is controlled to be turned on and off by both the electric signal and the light signal, thereby allowing the light emitting element to be controlled to emit light or not to emit light.

According to a preferred embodiment, there is provided a semiconductor display section wherein a plurality of semiconductor display elements each comprised of a semiconductor light emitting element and a semiconductor light receiving element which is electrically connected in series with the semiconductor light emitting element so that the semiconductor light receiving element drives the semiconductor light emitting element when the semiconductor light receiving element becomes conductive and is arranged so that the semiconductor light receiving element becomes conductive upon receiving light from the semiconductor light emitting element are arranged in a matrix comprised of rows and columns; an optical control section having a laser diode array which generates a signal light for line-sequentially driving the plural number of semiconductor display elements, a lens array which converges the signal light from the laser diode array, and a mirror for deflecting the signal light from the lens array; and an optical guide section which guides the signal light from the mirror of the optical control section to the semiconductor light receiving element of the semiconductor display section.

In the above-mentioned preferred embodiment, the laser diode array of the optical control section generates the signal light for line-sequentially driving the plural number of semiconductor display elements. Then, the lens array converges the signal light emitted from the laser diode array. Then, the mirror deflects the signal light from the lens array.

Then, the signal light outputted from the mirror of the optical control section is made to enter into the optical guide section. Then the signal light which has made to enter into the optical guide section is guided to the semiconductor light receiving element of the semiconductor display section.

Then, the semiconductor light receiving element to which the signal light is introduced becomes conductive. Then, an electric power is supplied from a power source to the semiconductor light emitting element which is electrically connected in series with the semiconductor light receiving element to make the semiconductor light emitting element emit light. Then, a part of the light from the semiconductor light emitting element enters into the semiconductor light receiving element to make the semiconductor light receiving element continue to be conductive. In other words, each semiconductor display element can self-hold it conductive or "on" state without continuing to supply the signal light from the optical guide.

As described above, in the present preferred embodiment, the semiconductor light emitting element is made to emit light by making conductive the semiconductor light receiving elements of the plural number of semiconductor display elements of the semiconductor display section by the signal light from the optical control section. With the above-mentioned arrangement, differing from the prior art, there is necessitated no electric wiring for driving the turning-on and turning-off of the semiconductor light emitting element. Therefore, according to the present preferred embodiment, the wiring structure can be simplified. Furthermore, since the wiring structure is simple, a cost reduction can be achieved.

Furthermore, in the present preferred embodiment, a part of the light from the semiconductor light emitting element is made to enter into the semiconductor light receiving element after the signal light from the optical control section turns on the semiconductor light receiving element. With the above-mentioned arrangement, the semiconductor display element self-holds its conductivity or "on" state. Therefore, the light emitting time of the semiconductor light emitting element can be increased to allow a bright display to be achieved.

Therefore, according to the present preferred embodiment, an inexpensive light emitting display device which has a simple wiring structure and is able to produce a bright screen display can be provided.

According to a preferred embodiment, the semiconductor light emitting element is comprised of a light emitting diode, and the semiconductor light receiving element is constituted by a photo-transistor.

In the present case, the semiconductor light emitting element and the semiconductor light receiving element may be made of different materials. With the above-mentioned arrangement, the semiconductor display element is allowed to be easily designed, and the semiconductor display element can be made inexpensive.

According to a preferred embodiment, the semiconductor display element is implemented by a light activated thyristor.

The light activated thyristor is an electric element equivalent to a circuit provided by electrically connecting a light emitting diode in series with a phototransistor. Therefore, in the case of the present preferred embodiment, the physical structure and the circuit structure are simplified, which allows an improved reliability, a simplified manufacturing process, and a cost reduction to be achieved.

According to a preferred embodiment, the optical guide section has a structure in which a waveguide sheet for transmitting the signal light from the optical control section and a reflection film for reflecting the signal light are alternately stacked one over the other in a laminate form.

In the present case, when the signal light propagating through the waveguide sheet travels in a direction of the thickness of the waveguide sheet and reaches the reflection film laminated with the waveguide sheet, the signal light is reflected on the reflection film. Therefore, according to the present preferred embodiment, the signal light can be prevented from leaking in the direction of the thickness of the waveguide sheet. Furthermore, the signal light travelling through the waveguide sheet can propagate while repeating reflection between both the reflection films which is interposing the waveguide sheet between them.

According to a preferred embodiment, the optical guide section has a light outlet portion including an inclined surface which reflects the signal light from the optical control section and guides the signal light to the semiconductor display element.

In the present case, the signal light propagating through the optical guide can be reflected on the inclined surface of the light outlet section had by the optical guide and then guided to the semiconductor display element.

According to a preferred embodiment, the laser diode array of the optical control section is implemented by a laser diode which emits infra-red light.

In the above-mentioned preferred embodiment, the signal light which propagates through the optical guide and is directed to the semiconductor display section has a wavelength different from that of the display light of the display section. Therefore, the display at the display section is not disturbed even though the signal light is mixed with the display light by any chance. Furthermore, since the laser diode which emits infra-red light is less expensive than any other type laser diode, the cost of the laser diode array for the driving use can be reduced.

According to a preferred embodiment, a light interruption member including a passage portion which allows the signal light from the optical guide section to pass toward the semiconductor light receiving element of the semiconductor display section, and an interrupting portion which prevents external light coming from outside the optical guide section from travelling toward the semiconductor light receiving element, and prevents the signal light coming from the optical guide section from entering into any other adjacent semiconductor display element is provided between the optical guide section and the semiconductor display section.

In the above-mentioned preferred embodiment, the light interruption member is provided between the optical guide section and the semiconductor display section. With the above-mentioned arrangement, external light is interrupted by the interruption portion of the light interruption member, thereby preventing the external light from entering into the semiconductor display section. Furthermore, the signal light from the optical guide section can be prevented from entering into other adjacent semiconductor display elements. Therefore, the possible erroneous operation of the semiconductor display section due to disturbance external light or a cross-talk from the optical guide section can be prevented.

According to a preferred embodiment, the semiconductor display section comprises: a plurality of semiconductor display elements arranged in a matrix comprised of rows and columns; a transparent wiring board which transmits the signal light from the optical guide section, and a light interruption frame board which prevents light from leaking to any element adjacent to the semiconductor display element so as to prevent a cross-talk from occurring.

In the above-mentioned preferred embodiment, the semiconductor display section has the construction in which the light interruption frame board is provided on the transparent substrate mounted with the semiconductor display element. With the above-mentioned arrangement, the display light of the semiconductor display element can be prevented from entering into any other adjacent element. Therefore, the possible erroneous operation of the semiconductor display section due to display leak light from any adjacent element can be prevented.

Furthermore, when the optical guide has the construction in which the opposite surface arranged opposite to the light interruption member (the opposite surface being the surface for outputting light toward the semiconductor display section) has a stairs-like shape, by making the opposite surface of the light interruption member arranged opposite to the opposite surface of the optical guide have a stairs-like shape such that the opposite surface is fitted to or engaged with the stairs-shaped opposite surface of the optical guide, the stairs-shaped portions of the optical guide and the light interruption member tightly mate with each other. With the above-mentioned arrangement, the surface opposite from the opposite surface of the optical guide and the light outlet surface of the light interruption member can be put in parallel with each other in a stable state. Therefore, a mechanically robust structure can be provided in an easy assembling manner.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 30 is an enlarged sectional view showing the structure of an essential part of the dot matrix LED section shown in FIG. 29;

FIG. 31A is a side sectional view showing the structure of a semiconductor display element of the dot matrix LED section shown in FIG. 30;

FIG. 31B is a side sectional view of a semiconductor display element composed of a light activated thyristor;

DETAILED DESCRIPTION OF THE PREFERRED EMBODIMENTS

The present invention will be described in detail based on several preferred embodiments thereof with reference to the accompanying drawings.

Figure 1:
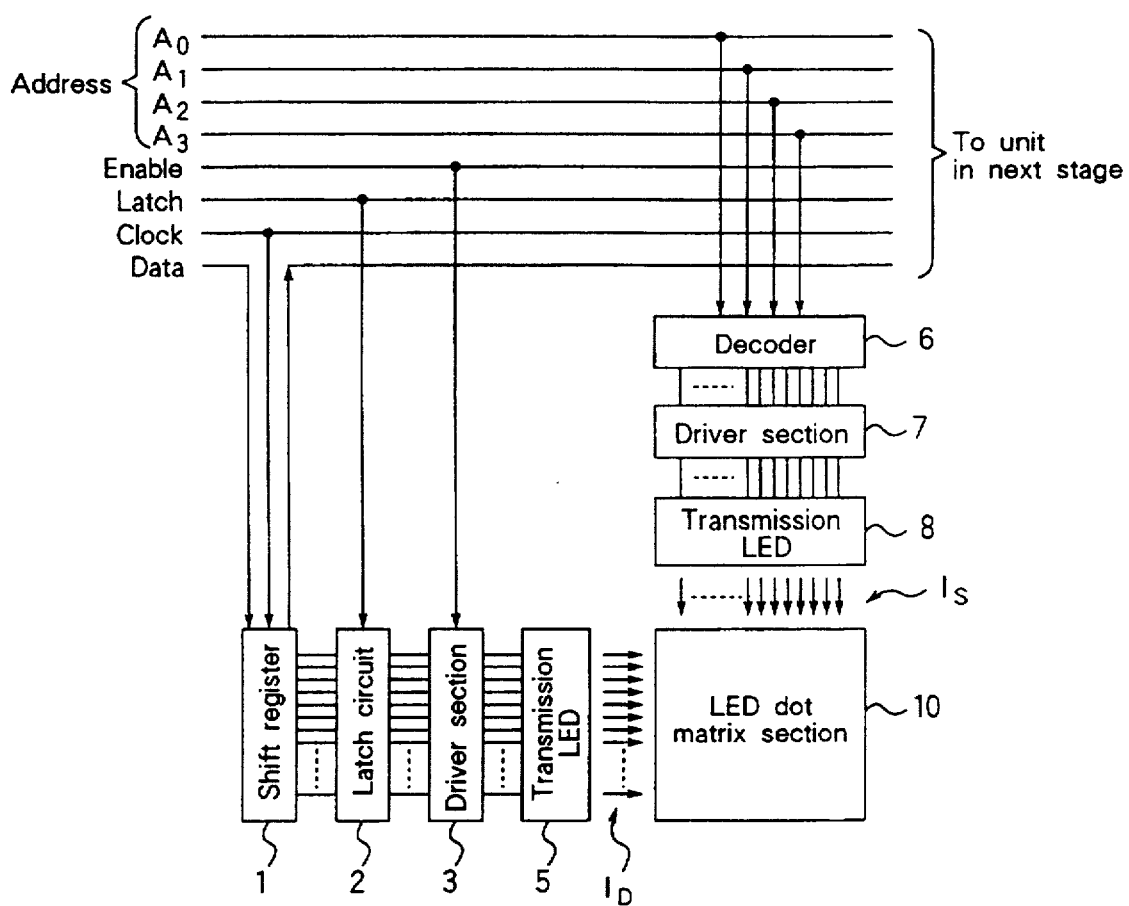
FIG. 1 is a block diagram of a light emitting display device according to a first embodiment of the present invention.

FIG. 1 is a block diagram of a light emitting display device according to a first embodiment of the present invention. The first embodiment is a dynamic drive type, and, as shown in FIG. 1, the device comprises: a data signal processing system including a shift register 1, a latch circuit 2, a driver section 3, and LEDs 5 for transmission use; and a scanning signal processing system including a decoder 6, a driver section 7, and LEDs 8 for transmission use; and an LED dot matrix section 10 for display use. The LEDs 5 and 8 are drive light output means.

The LED dot matrix section 10 receives a data signal light $I_D$ from the transmission LED 5 of the data signal processing system and a scanning signal light $I_S$ from the transmission LED 8 of the scanning signal processing system, and emits light to perform image display.

Figure 2:
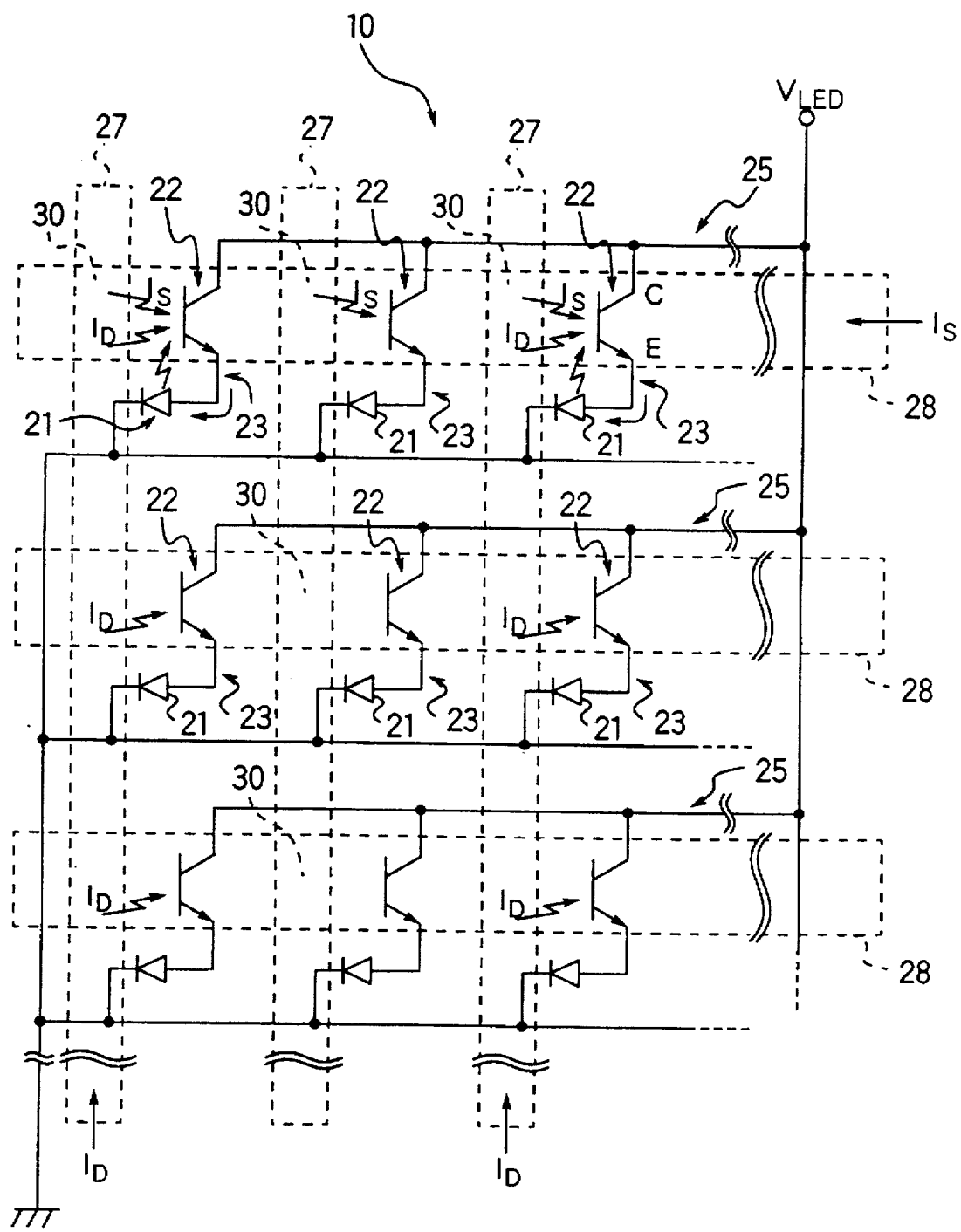
FIG. 2 is a circuit diagram of an LED dot matrix section of the first embodiment.

As shown in FIG. 2, the LED dot matrix section 10 has light emitting diodes 21, 21, 21, . . . arranged in a matrix form. Each light emitting diode 21 is connected in series with a photo-transistor 22. A plurality of series circuits 23 each composed of the light emitting diode 21 and the photo-transistor 22 are connected in parallel with each other to form one scanning unit circuit 25. Each scanning unit circuit 25 is connected across a power source having a voltage $V_{LED}$ and the ground.

The LED dot matrix section 10 has a data signal optical guide 27 and a scanning signal optical guide 28. The data signal optical guide 27 and the scanning signal optical guide 28 orthogonally intersect each other, and each intersection 30 is adjoining to the photo-transistor 22.

The data signal optical guide 27 guides the data signal light $I_D$ from the transmission LED 5 of the data signal processing system to the photo-transistor 22, while the scanning signal optical guide 28 guides the scanning signal light $I_S$ from the transmission LED 8 of the scanning signal processing system to the photo-transistor 22. The phototransistor 22 is designed to be turned on upon receiving both the scanning signal light $I_S$ and the data signal light $I_D$. In other words, neither the data signal light $I_D$ nor the scanning signal light $I_S$ has a light intensity sufficient for singly making the photo-transistor 22 conductive, and the photo-transistor 22 can be made conductive only when both the lights cooperate.

Figure 12:
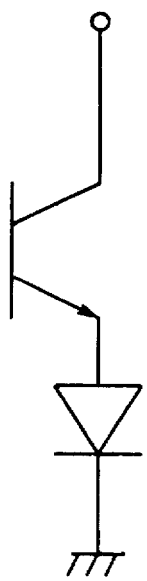
FIG. 12 is a circuit diagram of a series circuit composed of the photo-transistor and the light emitting diode of the first embodiment.

Furthermore, the light emitting diode 21 and the photo-transistor 22 are arranged in a manner that a part of the light emitted from the light emitting diode 21 enters into the photo-transistor 22 connected in series with the light emitting diode 21. Therefore, once the phototransistor 22 is put in a conductive state, the light emitting diode 21 lights and a part of the emission light irradiates the photo-transistor 22, and the conductive state of the photo-transistor 22 continues. In other words, the photo-transistor 22 and the light emitting diode 21 constitute a circuit as shown in FIG. 12 to obtain a negative resistance characteristic.

Figure 7:
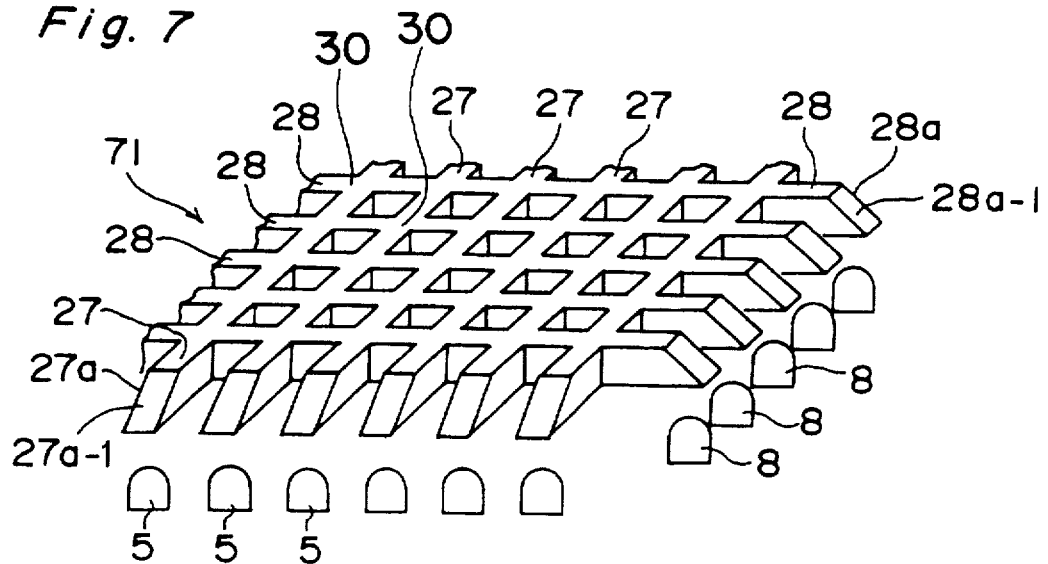
FIG. 7 is a perspective view of a grating-shaped optical guide.

FIG. 7 is a perspective view of a grating-shaped optical guide 71 which integrally includes the data signal optical guide 27 and the scanning signal optical guide 28 in an identical plane. As shown in FIG. 7, the data signal optical guide 27 of the optical guide 71 includes a tapered surface 27a-1 at its end portion 27a to which a drive light from the LED 5 is inputted. Meanwhile, the scanning signal optical guide 28 includes a tapered surface 28a-1 at its end portion 28a to which a drive light from the LED 8 is inputted. The optical guide 71 is preferably formed of polycarbonate or acrylic resin, whereas it is permitted to be formed of a transparent medium such as a resin having a high light transmittance or glass.

Figure 8:
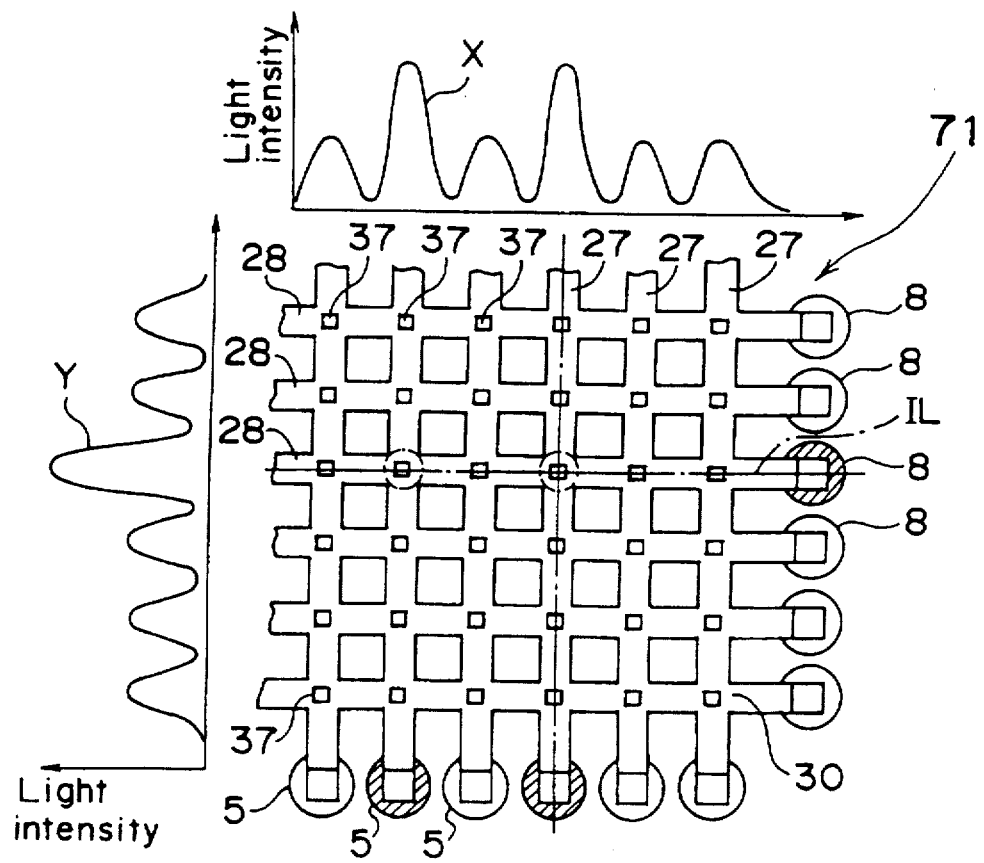
FIG. 8 is a plan view of the optical guide.
Figure 9A:
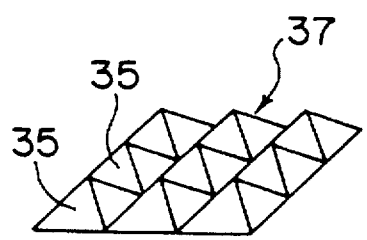
FIGS. 9A and 9B are perspective views of reflectors provided for the optical guide.
Figure 9B:
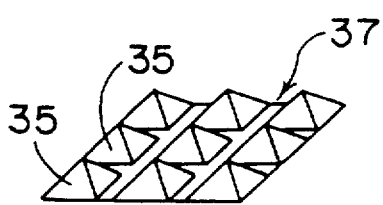

The intersection 30 of the optical guide 71 is provided with a blade 37 where a plurality of quadrangular pyramid-shaped reflecting portions 35 are arranged in a matrix form as shown in FIG. 9A or FIG. 9B. In the blade 37 shown in FIG. 9A, bottom peripheral edges of the reflecting portions 35 are put in contact with each other. In the blade 37 shown in FIG. 9B, bottom peripheral edges of the reflecting portions 35 are separated from each other. In other words, the reflecting portions 35 shown in FIG. 9A are dimensionally greater than the reflecting portions 35 shown in FIG. 9B. Then, by means of the blade 37, the scanning signal light and the data signal light are taken out of each intersection 30 in a direction perpendicular to the grating-shaped plane of the optical guide 71. With the above-mentioned operation, a wavy light emitting pattern X as shown in FIG. 8 is formed on a scanning light incident line IL of the scanning signal optical guide 28. Then, by sequentially scanning the scanning signal optical guide 28, a two-dimensional light intensity modulation pattern can be formed on the optical guide 71.

Since the optical guide 71 has a structure in which the data signal optical guide 27 and the scanning signal optical guide 28 are integrally formed in an identical plane, the optical guide has a simple compact structure.

The LED dot matrix section 10 is so designed that it is reset after completely displaying one screen and then a power source of voltage $V_{LED}$ is turned off, thereby erasing the display on the entire screen.

Figure 3:
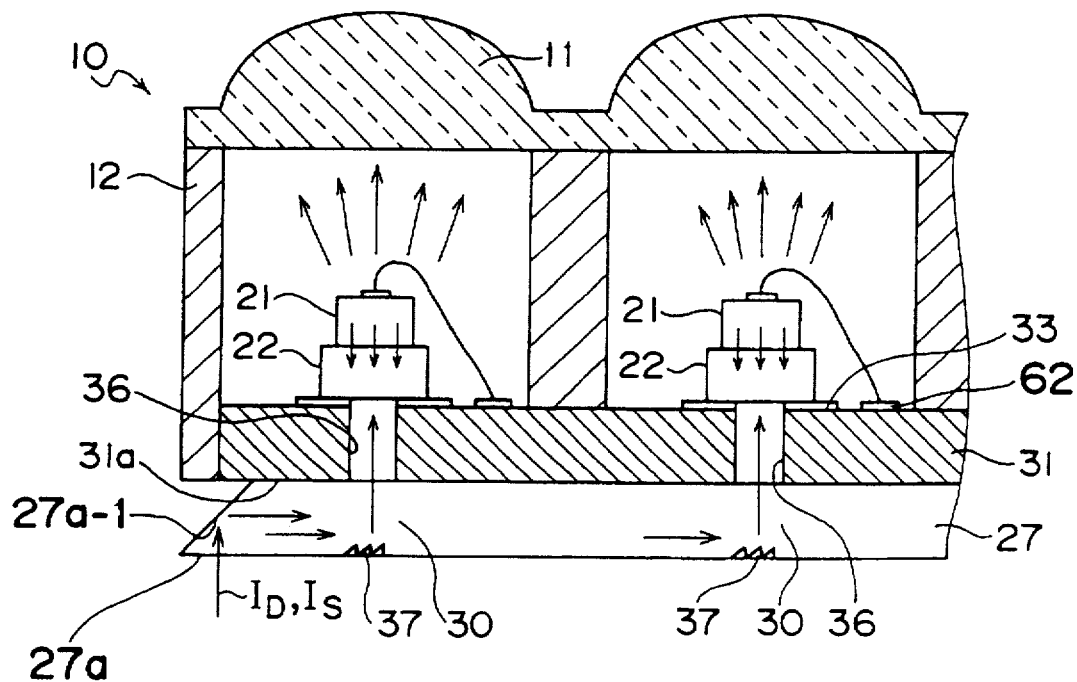
FIG. 3 is a sectional view of an essential part of the LED dot matrix section of the first embodiment.

FIG. 3 shows the structure of an essential part of the LED dot matrix section 10. In the LED dot matrix section 10 as shown in FIG. 3, each photo-transistor 22 is fixed on an electrode pad 33 of a mounting substrate 31, and each light emitting diode 21 is fixed on the phototransistor 22. There are further provided a lens array 11 and a light interruption frame 12. The photo-transistor 22 is a hetero-junction photo-transistor which has its emitter layer and its collector layer made of GaAlAs, and has its base layer made of GaAs. The light emitting diode 21 is wire-bonded to a ground electrode pad section 62 on the mounting substrate 31. The mounting substrate 31 is formed to have a through hole 36 which reaches the phototransistor 22. On a bottom surface 31a of the mounting substrate 31 is fixed the data signal optical guide 27. Then, the intersection 30 of the data signal optical guide 27 which intersects the scanning signal optical guide 28 is arranged opposite to the through hole 36, and the blade 37 which serves as a reflector is provided at the intersection 30. A mirror may be provided instead of the blade 37.

The reflection surface of the blade 37 shown in FIG. 9A provided at an intersection 30 located far away from the light source of each signal light is dimensionally made greater than the reflection surface of the blade 37 shown in FIG. 9B provided at an intersection 30 located near the light source. With the above-mentioned arrangement, there can be prevented a reduction in quantity of light entering into the photo-transistor 22 according as a distance between the photo-transistor 22 and the light source of the signal light increases, and the quantity of signal light entering from the intersection 30 into the photo-transistor 22 can be uniformed.

As shown in FIG. 3, the data signal light $I_D$ enters from under the end portion 27a of the data signal optical guide 27 and is reflected on the tapered surface 27a-1. Then, the data signal light $I_D$ travels horizontally along the optical guide 27 to be further reflected on the blade 37, and then travels through the through hole 36 to enter into the photo-transistor 22.

Meanwhile, in the same manner as above, the scanning signal light $I_S$ travels along the scanning signal optical guide 28 to be reflected on the blade 37, and then travels through the through hole 36 to enter into the photo-transistor 22.

Figure 4:
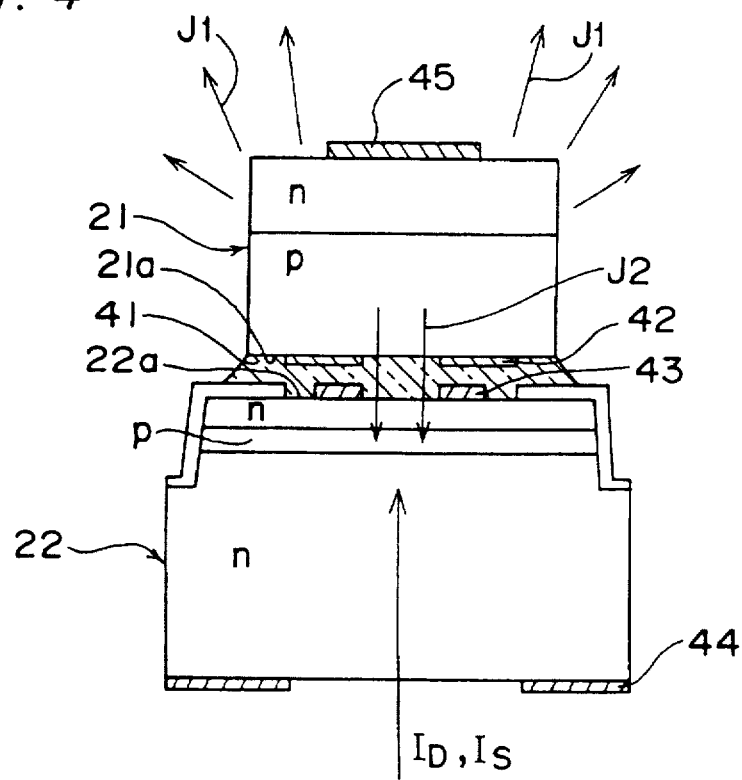
FIG. 4 is a sectional view showing a phototransistor, a light emitting diode, and a connection structure thereof of the first embodiment.

FIG. 4 shows a connection structure of the light emitting diode 21 and the photo-transistor 22. The light emitting diode 21 is fixed on the photo-transistor 22 by means of a transparent conductive paste 41, where an anode electrode 42 of the light emitting diode 21 is arranged opposite to an emitter electrode 43 of the photo-transistor 22, and the emitter electrode 43 is electrically connected to the anode electrode 42. A collector electrode 44 of the photo-transistor 22 is electrically connected to the electrode pad 33 on the mounting substrate 31. A cathode electrode 45 of the light emitting diode 21 is wire-bonded to the ground electrode pad section 62 of the mounting substrate 31.

The emitter electrode 43 of the photo-transistor 22 is a partial electrode which partially covers a light receiving surface 22a of the photo-transistor 22. The anode electrode 42 of the light emitting diode 21 is a partial electrode which partially covers an opposite surface 21a of the light emitting diode 21 opposite to the light receiving surface 22a. Thus light emitted from a part of the opposite surface 21a of the light emitting diode 21 is allowed to reach a part of the light receiving surface 22a of the photo-transistor 22 without being interrupted by the anode electrode 42 or the collector electrode 43. Each of the aforementioned partial electrodes preferably has a net-like shape, a comb-like shape, or a polka-dot-like shape. As shown in FIG. 4, a light J1 which is directed upward above the cathode electrode 45 is the display light, while a light J2 which is directed downward below the anode electrode 42 is the signal light for continuously putting the photo-transistor 22 in the conductive state.

Figure 26:
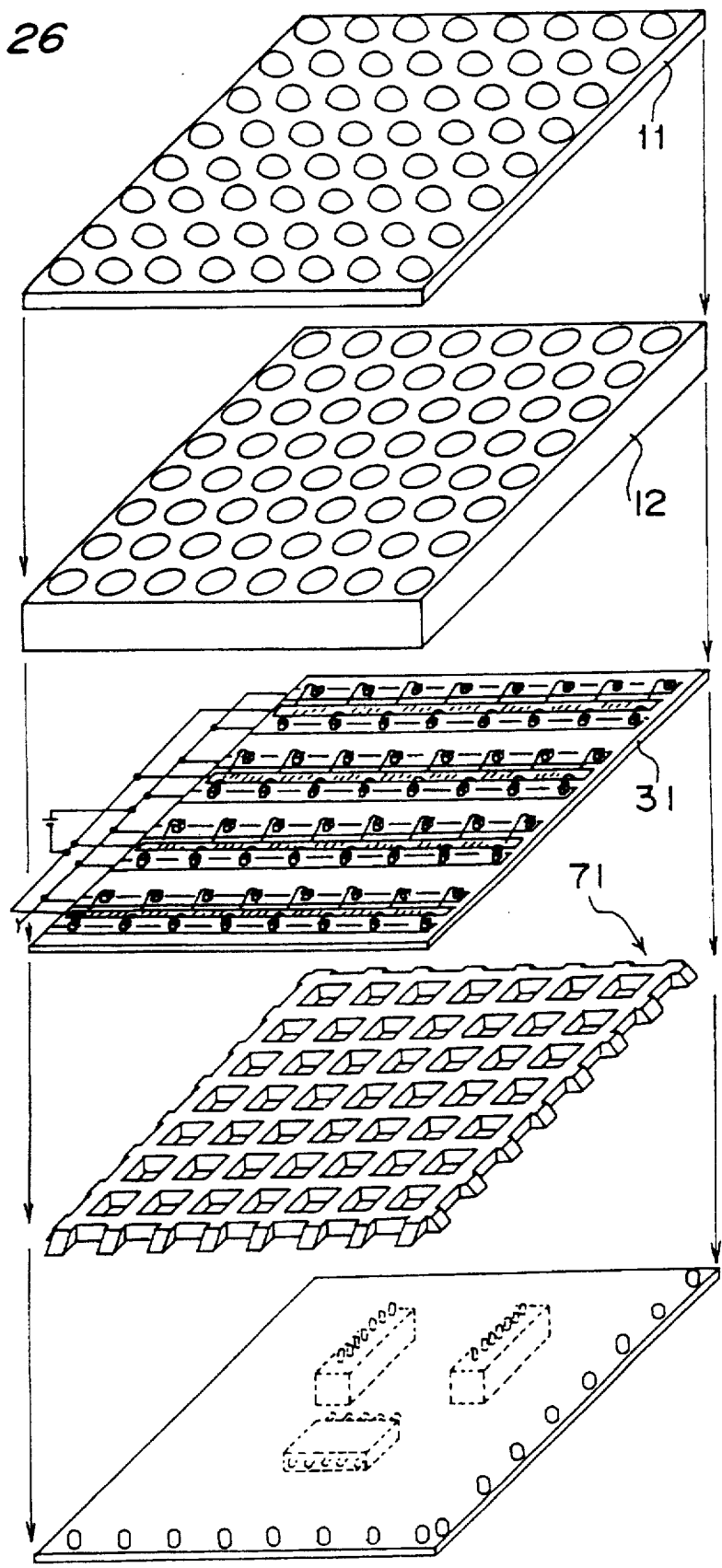
FIG. 26 is an explanatory view of the structure of the display section of the first embodiment.

FIG. 26 is an exploded perspective view for explaining the structure of the entire display section of the first embodiment.

In the first embodiment having the aforementioned construction, the data signal light $I_D$ and the scanning signal light $I_S$ are transmitted to the LED dot matrix section 10 respectively from the data signal transmission LED 5 and the scanning signal transmission LED 8 shown in FIG. 1. Then, the data signal light $I_D$ and the scanning signal light $I_S$ travel respectively through the data signal optical guide 27 and the scanning signal optical guide 28 of the LED dot matrix section 10 shown in FIG. 2, and reach the light receiving surface 22a of the photo-transistor 22. Then, only a photo-transistor 22 which has received both the data signal light $I_D$ and the scanning signal light $I_S$ becomes conductive to electrically conduct the light emitting diode 21 connected in series with the phototransistor to the power source, thereby making the light emitting diode 21 emit light. Then, a part of the light emitted from the light emitting diode 21 enters into the light receiving surface 22a of the phototransistor 22. Therefore, the photo-transistor 22 continues to be conductive while the light emitted from the light emitting diode 21 is entering into the light receiving surface 22a even after the data signal light $I_D$ and the scanning signal light $I_S$ stop entering into the light receiving surface 22a. The light emitting diode 21 which has been made conductive in a manner as described above continues to light until the resetting is effected before a signal of the next screen is transmitted.

In the first embodiment, the data signal and the scanning signal of the dynamic drive type is converted into the light signals $I_D$ and $I_S$ respectively by the transmission LEDs 5 and 8, and both the light signals $I_D$ and $I_S$ are guided to the photo-transistor 22 via the optical guide 71 to turn on the photo-transistor 22 and make the light emitting diode 21 emit light. With the above-mentioned arrangement, the wiring structure can be simplified as compared with the conventional dynamic drive type light emitting display device which has required an electric wiring having a laminate structure for the purpose of transmitting the data signal and the scanning signal to each light emitting diode.

Furthermore, the first embodiment has a chip-on-chip structure in which the light emitting diode 21 is mounted directly on the photo-transistor 22. With the above-mentioned arrangement, a part of the light emitted from the light emitting diode 21 irradiates the phototransistor 22 to continue the conductive or "on" state of the photo-transistor 22. In other words, the series circuit composed of the phototransistor 22 and the light emitting diode 21 is able to have a memory function.

Furthermore, according to the first embodiment, a part of the light emitted from the light emitting diode 21 is made to enter into the light receiving surface 22a of the photo-transistor 22 to be able to make the phototransistor 22 conductive. Therefore, the light emitting time of the light emitting diode 21 can be increased more than that in the conventional case to allow a bright display to be achieved. In other words, the light emitting diode 21 is made to emit light by the conduction of the photo-transistor 22, and the light emitted from the light emitting diode 21 is irradiated on the photo-transistor 22. Therefore, the conductive state of the photo-transistor 22 can be continued without externally inputting any signal to the photo-transistor 22. Therefore, a bright display can be achieved.

Furthermore, the data signal light $I_D$ and the scanning signal light $I_S$ can be efficiently guided to the light receiving surface 22a of the photo-transistor 22 by means of the data signal optical guide 27 and the scanning signal optical guide 28. Furthermore, the optical guide 71 is made to have a grating-like shape which integrally includes the data signal optical guide 27 and the scanning signal optical guide 28 in an identical plane. With the above-mentioned arrangement, the structure of the light emitting display device can be simplified to allow a compact and light-weight light emitting display device to be provided.

Furthermore, the first embodiment has the chip-on-chip structure in which the light emitting diode 21 is mounted on the photo-transistor 22 in a manner as shown in FIG. 4. With the above-mentioned arrangement, the light emitted from the light emitting diode 21 can be easily irradiated on the photo-transistor 22, and the element mounting area can be reduced.

Furthermore, according to the first embodiment, the emitter electrode 43 of the photo-transistor 22 and the anode electrode 42 of the light emitting diode 21 are each made to be a partial electrode in a manner as shown in FIG. 4 to allow light to be transmitted to the light receiving surface of the photo-transistor 22 from the opposite surface of the light emitting diode 21 opposite to the photo-transistor 22. With the above-mentioned arrangement, the photo-transistor 22 is allowed to have a chip size equivalent to that of the light emitting diode 21. Furthermore, unnecessary external light from other than the light emitting diode 21 can be prevented from entering into the light receiving surface 22a of the photo-transistor 22 by the light emitting diode 21 itself.

Figure 14:
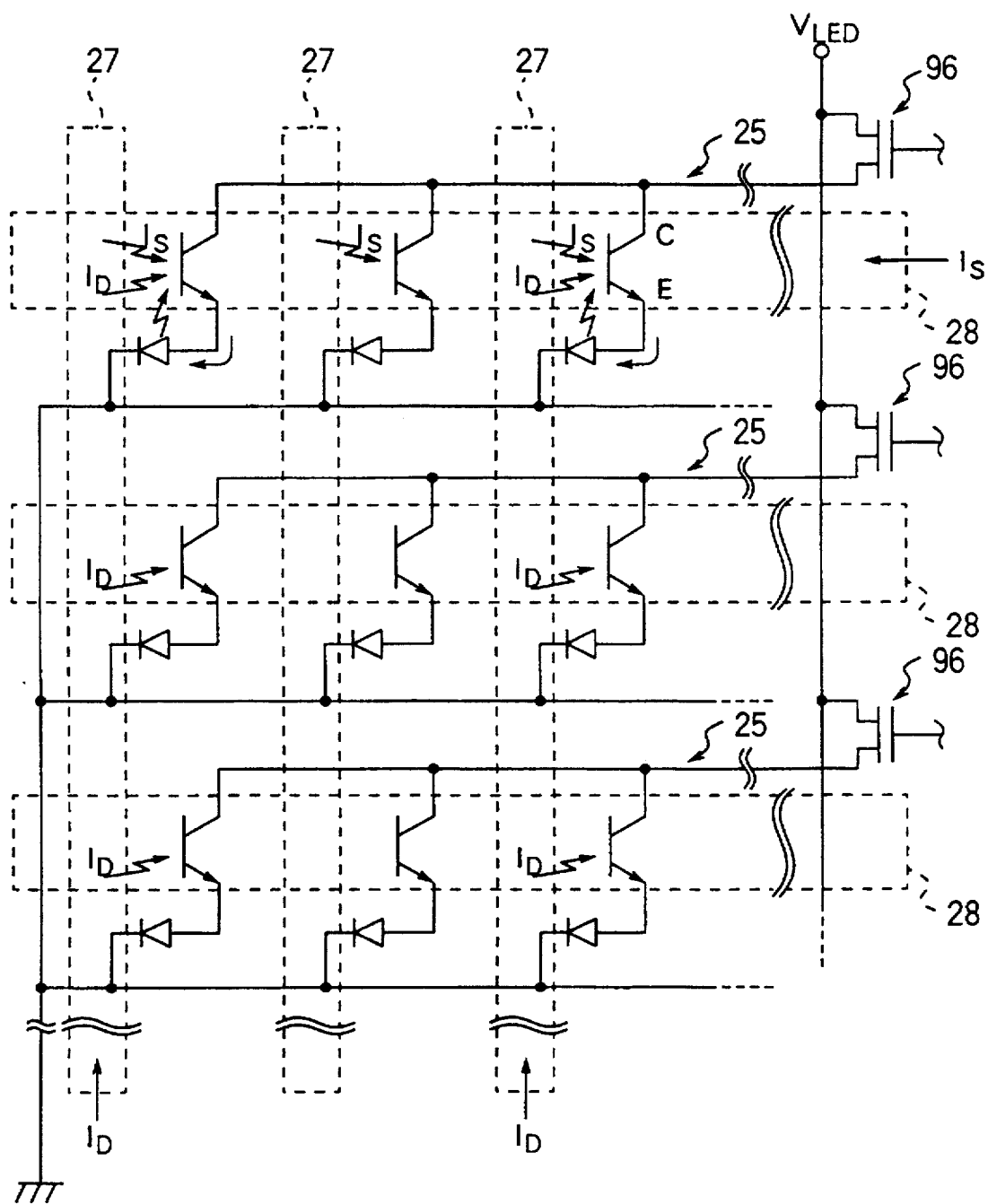
FIG. 14 is a circuit diagram of a modification of the LED dot matrix section of the first embodiment.

Although each scanning unit circuit 25 is connected directly to the power source in the first embodiment in a manner as shown in FIG. 2, an FET (field-effect transistor) 96 may be provided as a reset switch for every scanning unit circuit 25 in a manner as shown in FIG. 14. The FET 96 is connected across the power source and the scanning unit circuit 25, and is made to receive a reset signal at its gate. In the above-mentioned case, by turning on and off the FET 96 by means of the reset signal, the timing of putting out light of the light emitting diode 21 can be controlled every scanning unit circuit 25, or every scanning line. Therefore, for example, the light emitting time of the light emitting diode 21 of each scanning unit circuit 25 can be set uniformly. Furthermore, luminance of the display can be adjusted by controlling the duration of the light emitting time of the light emitting diode 21. When there is provided no reset switch (FET 96) as in the first embodiment shown in FIG. 2, the light emitting diodes of the scanning line which has been firstly lit is to light for a longest time, and the light emitting diodes of the scanning line which has been lastly lit is to light for a shortest time.

Figure 15:
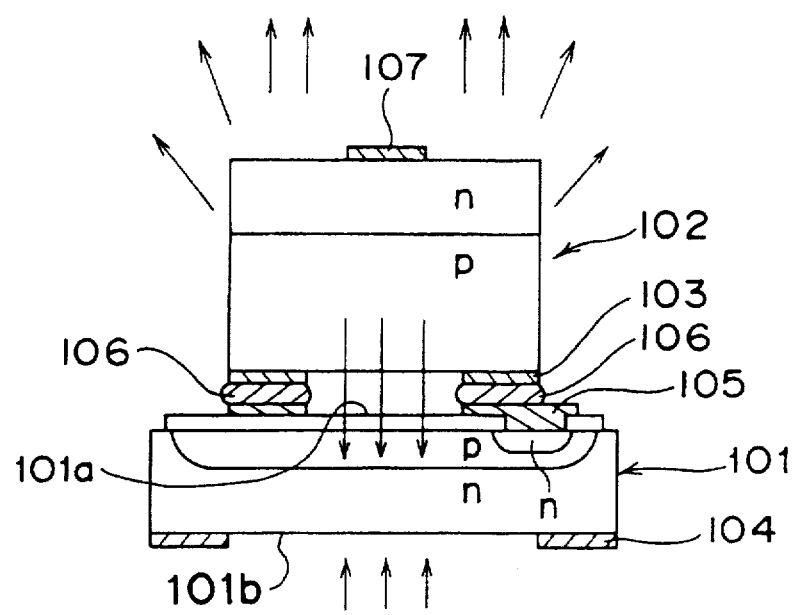
FIG. 15 is a sectional view showing a phototransistor, a light emitting diode, and a connection structure thereof of a modification of the first embodiment.
Figure 16:
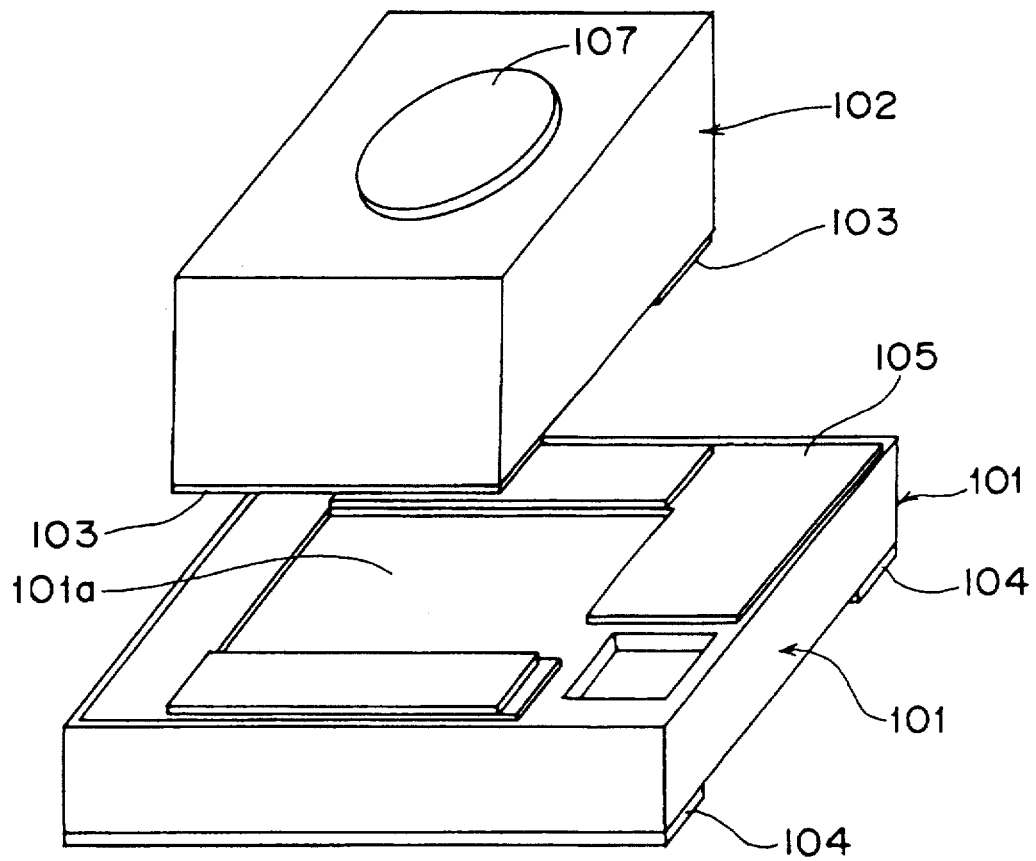
FIG. 16 is a perspective view for explaining the connection structure shown in FIG. 15.

Furthermore, the light emitting diode, the phototransistor, and the connection structure thereof are arranged in a structure as shown in FIG. 4 in the first embodiment, a structure as shown in FIG. 15 or FIG. 16 may be adopted instead of the structure shown in FIG. 4. A feature of the structure is that the photo-transistor is made to be an Si photo-transistor 101, and the Si phototransistor 101 is made to have a thickness of not greater than 150 µm. With the above-mentioned arrangement, the Si photo-transistor 101 operates also in response to a light signal emitted from an infra-red light emitting diode and received on a rear surface 101b thereof. FIG. 16 shows a structure in which a light emitting diode 102 is mounted on the Si photo-transistor 101. The above-mentioned structure is the same as the structure shown in FIG. 4 in regard to a point that both an anode electrode 103 of the light emitting diode 102 and an emitter electrode 105 of the photo-transistor 101 are provided by a partial electrode. Then, the anode electrode 103 and the emitter electrode 105 are connected with each other by means of solder 106. However, the anode electrode and the emitter electrode may be connected with each other by means of a transparent conductive paste in the same manner as in the structure shown in FIG. 4.

Another feature of the structure is that the emitter electrode 105 of the photo-transistor 101 is surrounding the surface 101a which serves as a light receiving surface in a manner as shown in FIG. 16. Therefore, the emitter electrode 105 serves as a mask for interrupting external light directed to the light receiving surface 101a. With the above-mentioned arrangement, a possible erroneous operation of the photo-transistor 101 due to the external light can be prevented. A mask which surrounds the light receiving surface 101a to interrupt the external light may be provided separately from the emitter electrode 105.

Figure 5:
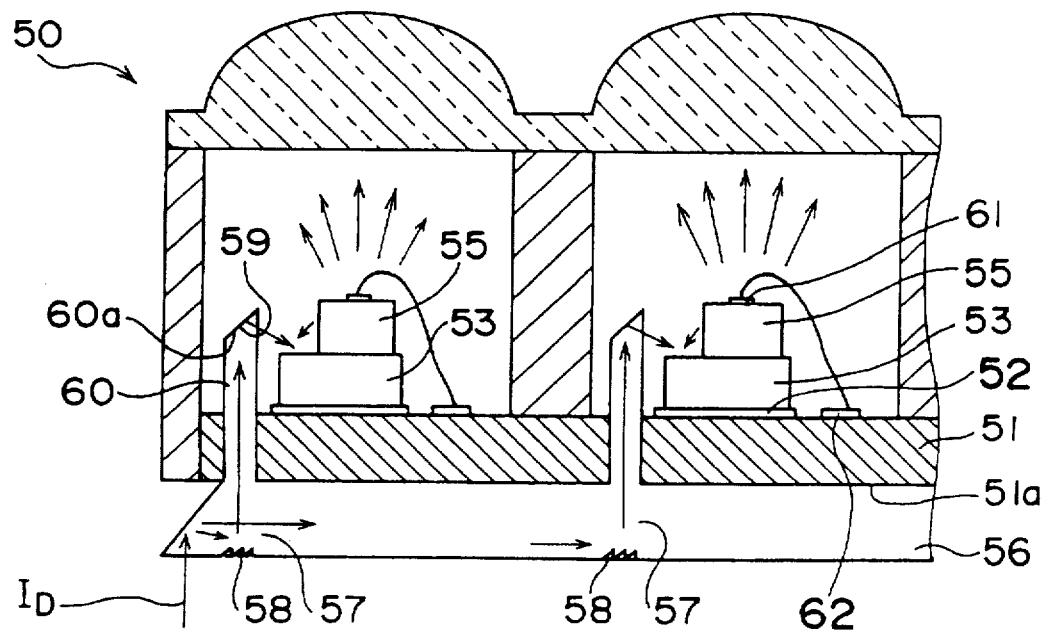
FIG. 5 is a sectional view showing the structure of an essential part of a display section according to a second embodiment of the present invention.

FIG. 5 is a sectional view of an essential part of an LED dot matrix section 50 of a light emitting display device according to a second embodiment of the present invention. The second embodiment differs from the first embodiment only in the structure of the LED dot matrix section 50, and therefore the LED dot matrix section 50 will be chiefly described.

In the second embodiment as shown in FIG. 5, an Si photo-transistor 53 is fixed on an electrode pad 52 on a mounting substrate 51, while a light emitting diode 55 is fixed on the Si photo-transistor 53. Then a cathode electrode 61 of the light emitting diode 55 is wire-bonded to a ground electrode pad 62 on the mounting substrate 51.

On a bottom surface 51a of the mounting substrate 51 is fixed a data signal optical guide 56. The data signal optical guide 56 is formed by providing the data signal optical guide 27 of the first embodiment shown in FIG. 7 with an extension 60. A scanning signal optical guide of the second embodiment is formed by providing the scanning signal optical guide 28 of the first embodiment shown in FIG. 7 with an extension similar to the extension 60.

The extension 60 of the data signal optical guide 56 extends from each intersection 57 of the data signal optical guide and the scanning signal optical guide through the mounting substrate 51 to a space adjacent to the Si photo-transistor 53. An inclined surface 60a at the tip end of the extension 60 is provided with a mirror 59. A blade 58 is provided at a lower portion of each intersection 57.

Figure 6:
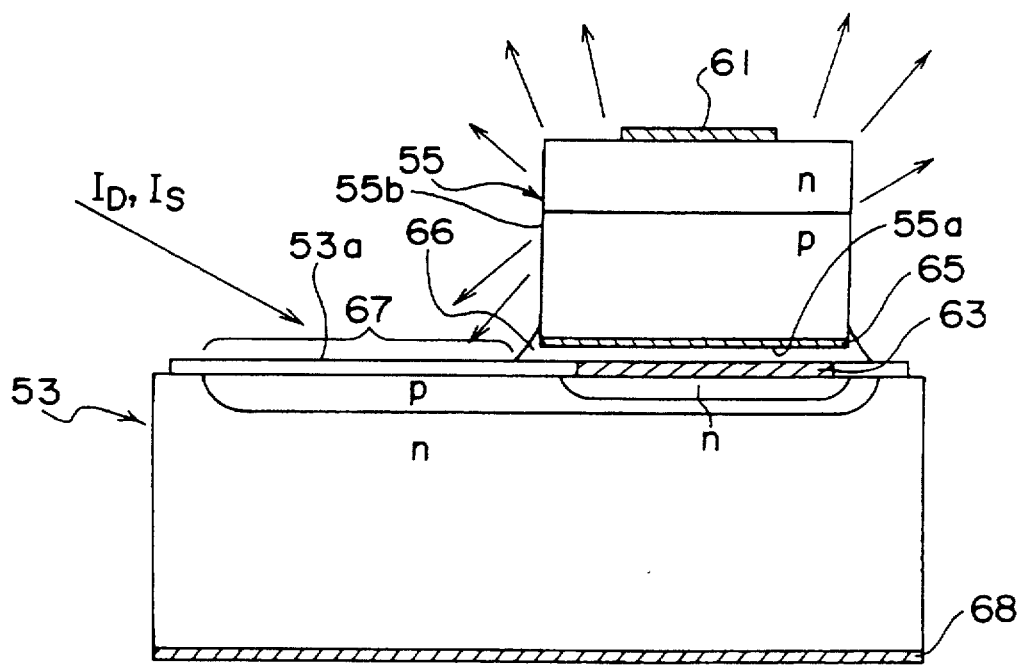
FIG. 6 is a sectional view showing a phototransistor, a light emitting diode, and a connection structure thereof of the second embodiment.

FIG. 6 shows a connection structure of the phototransistor 53 and the light emitting diode 55. The light emitting diode 55 is fixed on the photo-transistor 53 by means of a transparent conductive paste 66 so that an anode electrode 65 thereof is arranged opposite to an emitter electrode 63 of the photo-transistor 53. A bottom surface 55a of the light emitting diode 55 is not facing a light receiving surface 53a of the photo-transistor 53, and light from a side surface 55b of the light emitting diode 55 can enter into a light receiving area 67 of the phototransistor 53. Further, the data signal light $I_D$ and the scanning signal light $I_S$ which have travelled respectively through the data signal optical guide 56 and the scanning signal optical guide and reflected on the mirror 59 at the tip end of the extension 60 can enter into the light receiving area 67.

In the second embodiment, the photo-transistor 53 is turned on by the signal lights $I_D$ and $I_S$ to make the light emitting diode 55 emit light in the same manner as in the first embodiment. With the above-mentioned arrangement, the wiring structure can be simplified as compared with the conventional dynamic drive type light emitting display device which has required an electric wiring having a laminate structure for the purpose of transmitting the data signal and the scanning signal to each light emitting diode.

Furthermore, in the second embodiment, a part of the light emitted from the light emitting diode 55 is made to enter into the light receiving area 67 of the phototransistor 53. With the above-mentioned arrangement, the photo-transistor 53 can be made conductive with the light emitted from the light emitting diode 55 even after the signal lights $I_D$ and $I_S$ stop entering into the phototransistor 53. Therefore, the light emitting time of the light emitting diode 55 can be increased more than in the conventional case to allow a bright display to be achieved.

Furthermore, in the second embodiment, the data signal light $I_D$ and the scanning signal light $I_S$ can be efficiently transmitted to the light receiving area 67 of the phototransistor 53 by means of the data signal optical guide 56 and the scanning signal optical guide.

Figure 10:
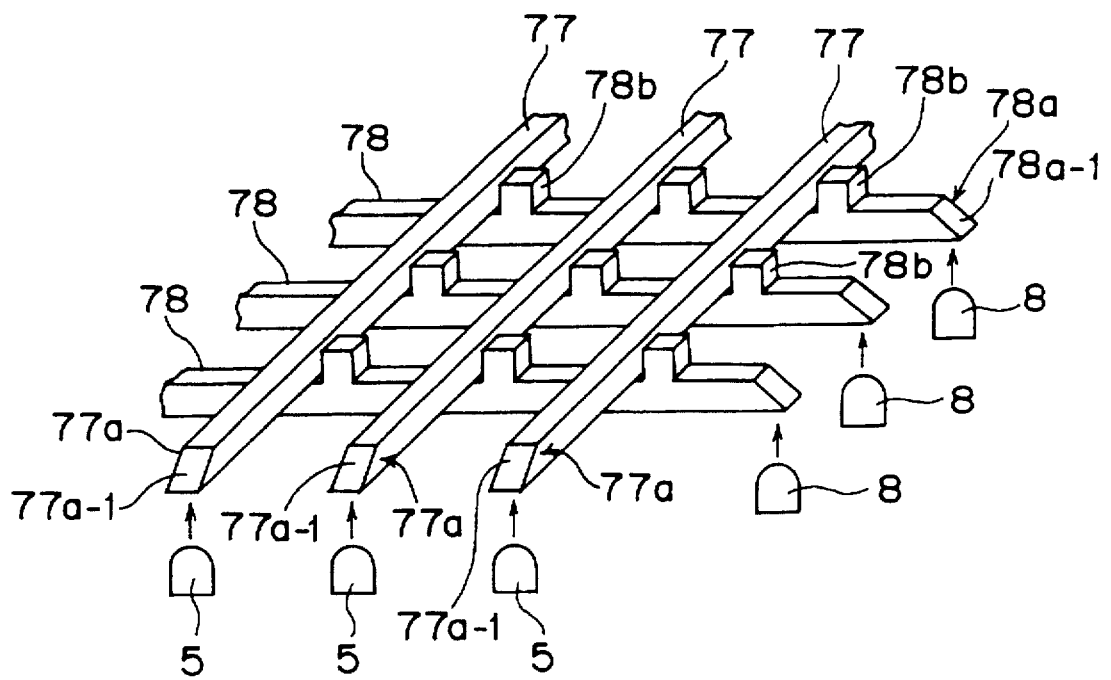
FIG. 10 is a perspective view of another optical guide.

Although each of the first and second embodiments is provided with the grating-shaped optical guide 71 in which the data signal optical guide and the scanning signal optical guide are integrally formed, as shown in FIG. 10, it is acceptable to separately provide a data signal optical guide 77 and a scanning signal optical guide 78 instead of the optical guide 71. The data signal optical guide 77 has an elongated thin square pillar-shaped structure. An end portion 77a to which the drive light from the light emitting diode 5 is inputted has a tapered surface 77a-1. On the other hand, the scanning signal optical guide 78 has an elongated thin square pillar-shaped structure which intersects the data signal optical guide 77 in different levels. An end portion 78a has a tapered surface 78a-1 to which the drive light from the light emitting diode 8 is inputted. The scanning signal optical guide 78 has an extension 78b which extends perpendicular to a signal scanning plane at a portion adjacent to each intersection thereof and the data signal optical guide 77.

The data signal optical guide 77 and the scanning signal optical guide 78 are preferably made of polycarbonate or acrylic resin, however, they are permitted to be made of a transparent medium such as a resin having a high transparency or glass.

Figure 9C:
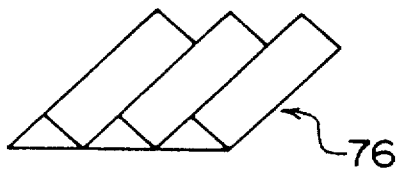
FIGS. 9C and 9D are perspective views of other reflectors.
Figure 9D:
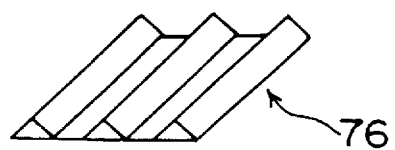
Figure 11:
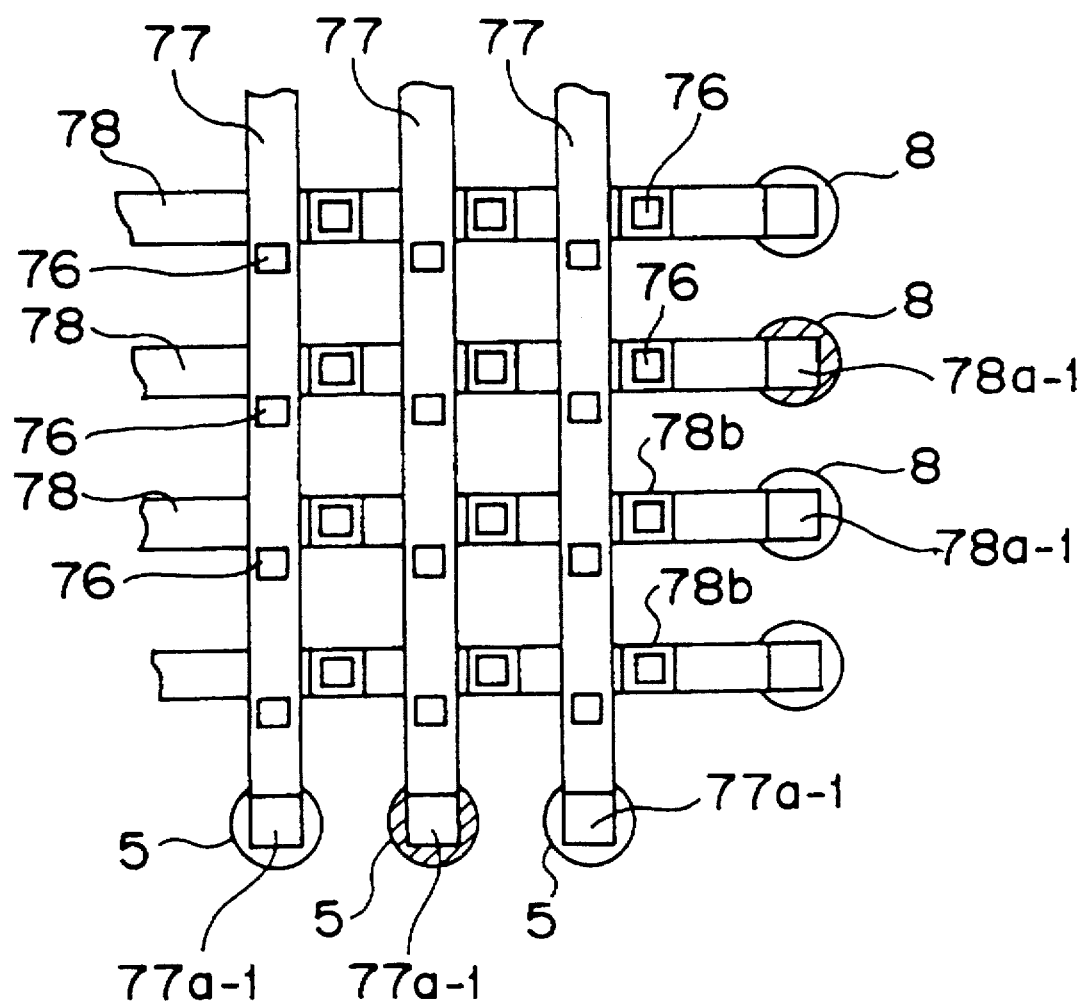
FIG. 11 is a plan view of the optical guide shown in FIG. 10.

As shown in FIG. 11, the data signal optical guide 77 has a blade 76 at a portion adjacent to each intersection thereof and the scanning signal optical guide 78. The scanning signal optical guide 78 has a blade 76 on its bottom surface opposite from the extension 78b. The blade 76 is a reflector constituted by arranging a plurality of trigonal prisms in a manner as shown in FIG. 9C and FIG. 9D. The reflection surface of the reflector shown in FIG. 9C is dimensionally greater than the reflector shown in FIG. 9D. The reflector having the greater reflection surface is provided farther away from the signal light source in comparison with the reflector having the smaller reflection surface. Then, the data signal light and the scanning signal light are transmitted respectively through the data signal optical guide 77 and the scanning signal optical guide 78, and then reflected on the blades 76 to enter into the photo-transistor 53 which serves as a light receiving element provided on the guides 77 and 78. When the data signal optical guide 77 and the scanning signal optical guide 78 are thus separately provided, the data signal light and the scanning signal light can be surely separated to allow the prevention of the possible cross-talk of a display pattern displayed by the light emitting display device.

Although both the data signal transmission LED and the scanning signal transmission LED are provided and both the data signal and the scanning signal are converted into light signals in each of the first and second embodiments, it is acceptable to provide either one of the data signal transmission LED and the scanning signal transmission LED.

Figure 18:
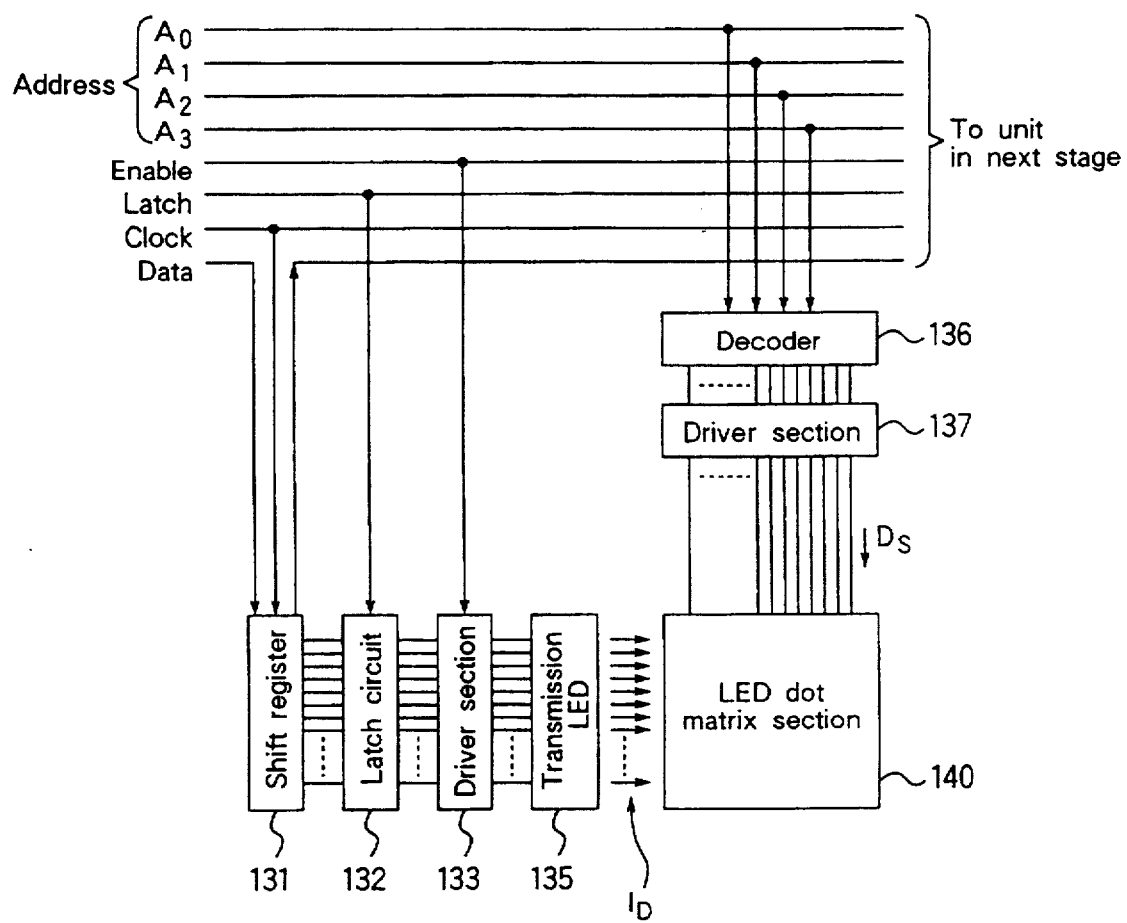
FIG. 18 is a block diagram of a modification of the second embodiment.

FIG. 18 is a block diagram of a light emitting display device having only a data signal transmission LED as a transmission LED. The light emitting display device transmits the data signal light $I_D$ from a data signal transmission LED 135 to an LED dot matrix section 140, while a scanning signal $D_s$ is transmitted from a scanning signal transmission driver 137 to the LED dot matrix section 140. The scanning signal $D_s$ is an electric signal.

Figure 17:
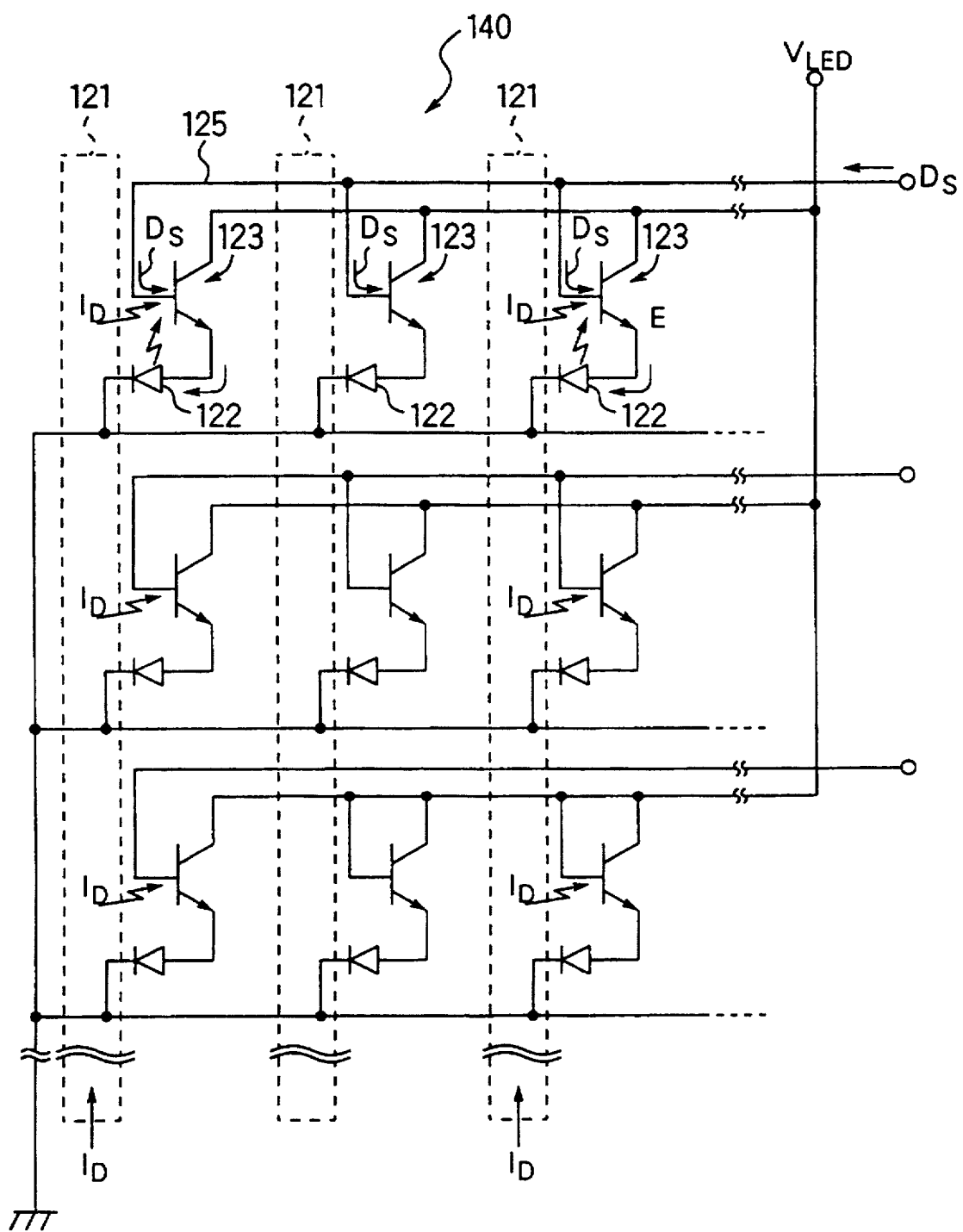
FIG. 17 is a circuit diagram of a display section of a modification of the second embodiment.

Therefore, as shown in FIG. 17, the LED dot matrix section 140 of the above-mentioned light emitting display device has only a data signal optical guide 121 for guiding the data signal light $I_D$ as a signal optical guide. The optical guide 121 guides the data signal light $I_D$ to a light receiving area of a photo-transistor 123 connected in series with a light emitting diode 122. Then, the scanning signal $D_s$ from the scanning signal transmission driver 137 is transmitted from the driver 137 to the base of the photo-transistor 123 through an electric wiring line 125 wired to the base of the photo-transistor 123. The phototransistor 123 is designed to be turned on when it simultaneously receives both the data signal light $I_D$ and the scanning signal $D_s$. When the phototransistor 123 is turned on, a current flows from the power source to the light emitting diode 122 to make the light emitting diode 122 emit light.

Figure 19:
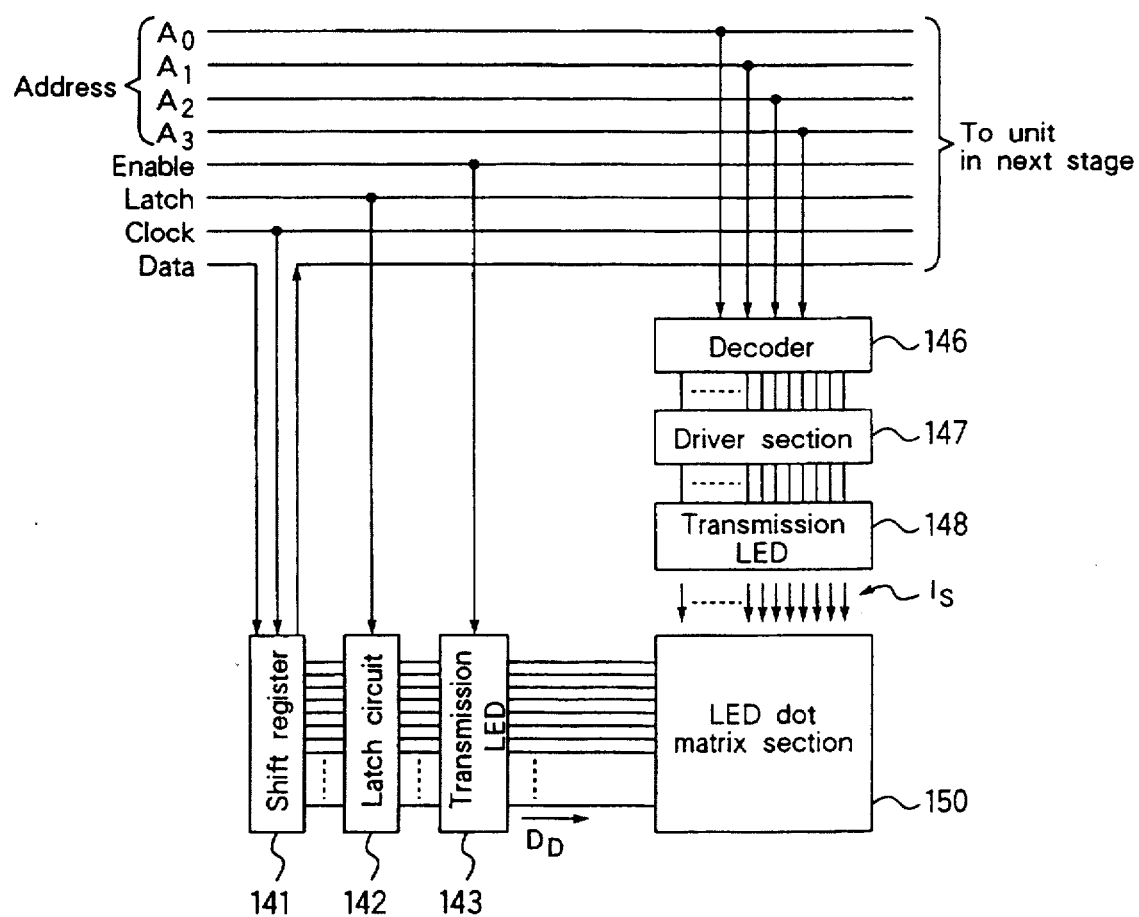
FIG. 19 is a block diagram of another modification of the second embodiment.

FIG. 19 is a block diagram of a light emitting display device having only a scanning signal transmission LED as a transmission LED. In the light emitting display device, the scanning signal light $I_S$ is transmitted from a scanning signal transmission LED 148 to an LED dot matrix section 150, while a data signal $D_D$ is transmitted from a data signal transmission driver section 143 to the LED dot matrix section 150. The data signal $D_D$ is an electric signal.

Figure 20:
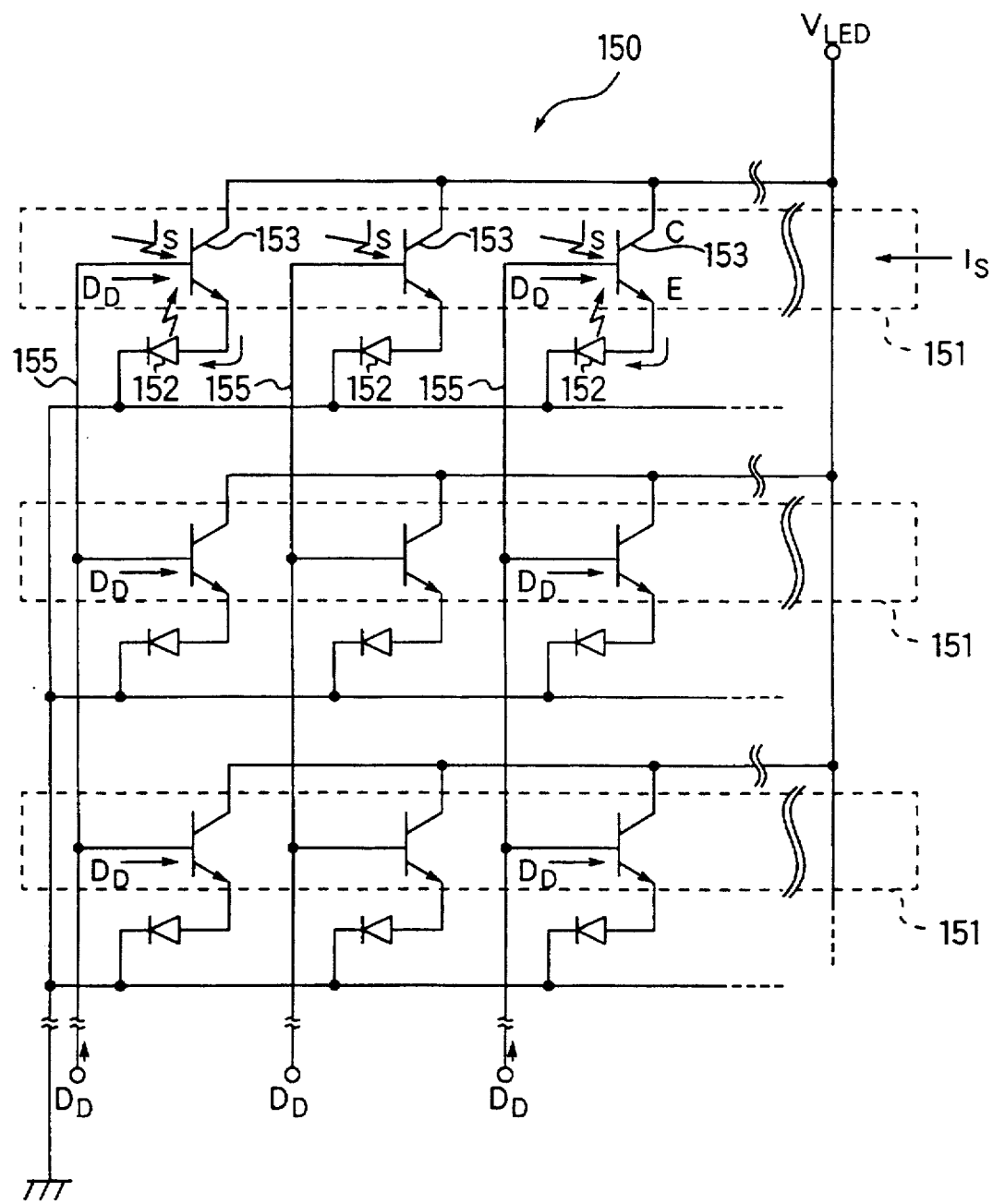
FIG. 20 is a circuit diagram of a display section of the modification shown in FIG. 19.

Therefore, as shown in FIG. 20, the LED dot matrix section 150 of the above-mentioned light-emitting display device has only a scanning signal optical guide 151 for guiding the scanning signal light $I_S$ as a signal optical guide. The optical guide 151 guides the scanning signal light $I_S$ to a light receiving area of a phototransistor 153 connected in series with a light emitting diode 152. Then, the data signal $D_D$ from the data signal transmission driver section 143 is transmitted from the driver section 143 to the photo-transistor 153 through an electric wiring 155 wired to a base of the photo-transistor 153. The photo-transistor 153 is designed to be turned on when it simultaneously receives both the scanning signal light $I_S$ and the data signal $D_D$. When the photo-transistor 153 is turned on, a current flows from the power source to the light emitting diode 152 to make the light emitting diode 152 emit light.

Although each of the first and second embodiments uses the photo-transistor as a light receiving element, a light activated thyristor having a switch function and a memory function may be used as a light receiving element.

Although the data signal processing system is provided with a latch circuit in each of the first and second embodiments, the latch circuit may be eliminated.

Figure 13:
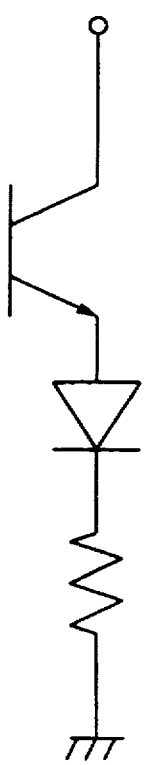
FIG. 13 is a circuit diagram of a circuit provided by connecting a resistor in series with the series circuit shown in FIG. 12.

Also, it is acceptable to connect a resistor in series with the light emitting diode in a manner as shown in FIG. 13 to make constant the current flowing through the light emitting diode.

The data signal light $I_D$ transmitted from the data signal transmission LED which serves as a data signal converter is visible light and the scanning signal light $I_S$ transmitted from the scanning signal transmission LED which serves as a scanning signal converter is visible light in each of the first and second embodiments. However, each of the signal light $I_D$ transmitted from the data signal transmission LED and the signal light $I_S$ transmitted from the scanning signal transmission LED may be invisible light. In the present case, even when the signal lights $I_S$ and $I_D$ leak out of the photo-transistor which serves as a light receiving element, the leaked signal light exerts no influence on the display at the LED dot matrix section. Furthermore, in the present case, by surrounding the light transmission passages of the signal lights $I_S$ and $I_D$ which travel from the signal transmission LEDs to the phototransistor with a material which allows visible light to pass but reflects or absorbs light having the same wavelength as that of the signal light, the signal light is not disturbed by external light, or light from the outside of the signal transmission passages, and therefore the possible erroneous operation can be prevented.

Furthermore, when the invisible light is infrared light, the signal transmission LED is allowed to be an infra-red LED. Therefore, the signal LED can be inexpensive and a high-speed signal transmission can be achieved.

Figure 21:
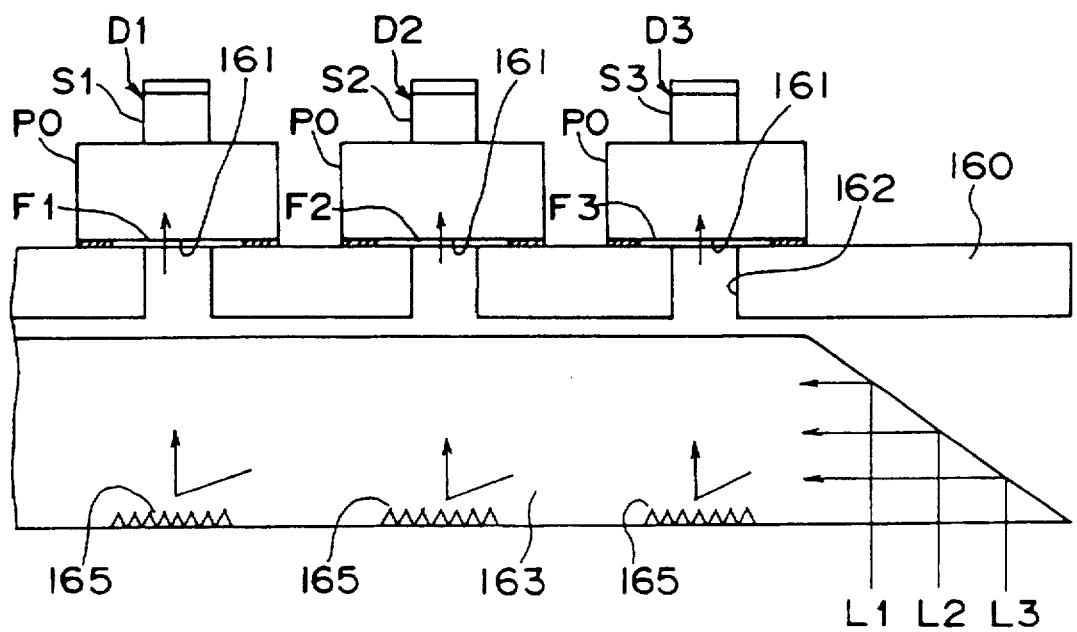
FIG. 21 is a sectional view of a part of a third embodiment.
Figure 25:
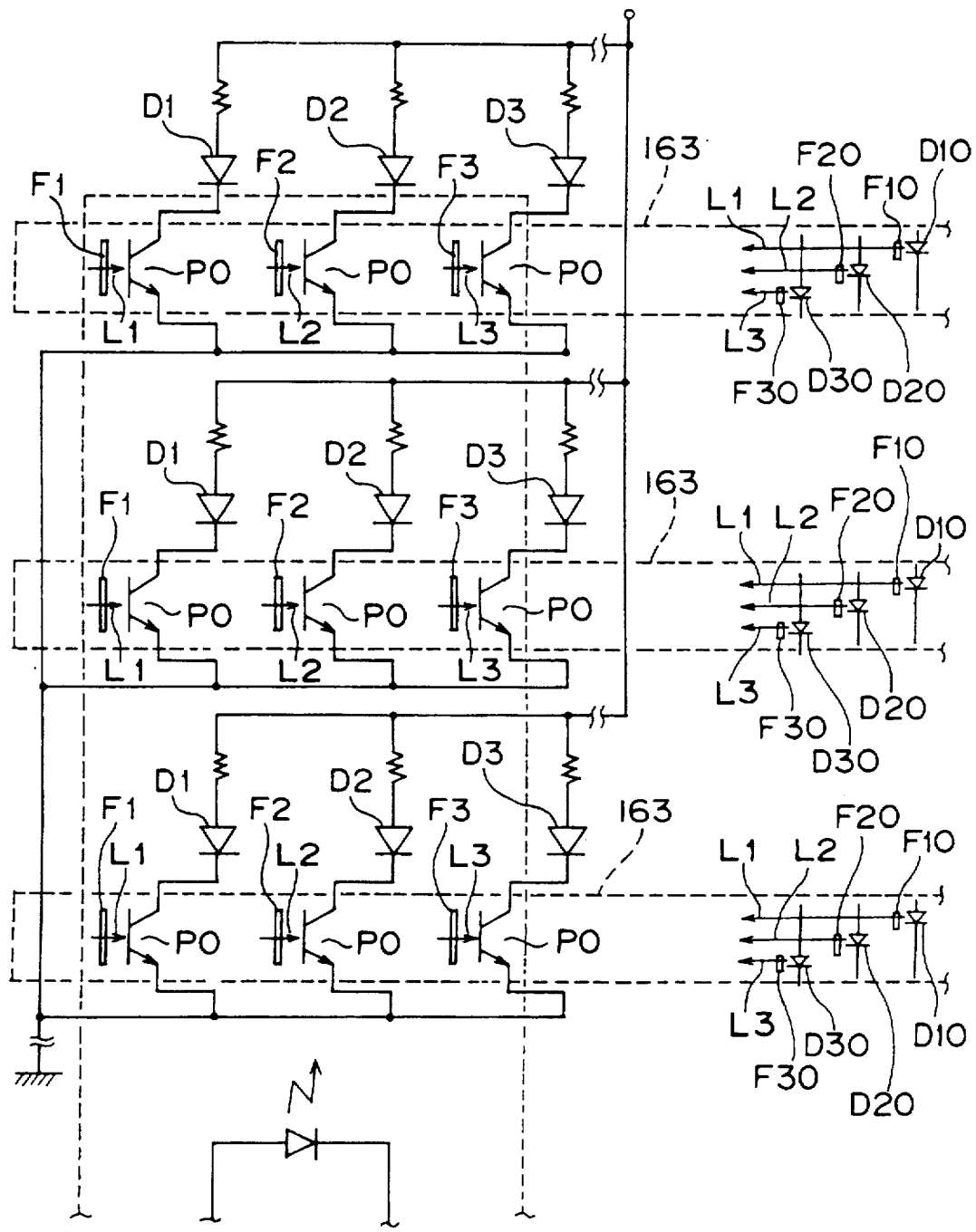
FIG. 25 is a circuit diagram of the third embodiment.

Then, FIG. 21 shows an essential part of a display section according to a third embodiment. The third embodiment has a red light emitting diode D1 which emits a red light, a green light emitting diode D2 which emits a green light, and a blue light emitting diode D3 which emits a blue light. The red light emitting diode D1, the green light emitting diode D2, and the blue light emitting diode D3 are respectively fixed on silicon (Si) photo-transistors PO, PO, and PO each of which serves as a light receiving element. As shown in FIG. 25, the red, green, and blue light emitting diodes D1, D2, and D3 are connected in series with the respective phototransistors PO, PO, and PO. The photo-transistors PO, PO, and PO are connected to the ground, and the light emitting diodes D1 through D3 are connected to the power source via respective resistors.

The photo-transistors PO, PO, and PO are made to be conductive upon receiving light from side surfaces S1, S2, and S3 of the light emitting diodes D1, D2, and D3, respectively. As shown in FIG. 21, each photo-transistor PO is fixed on a glass epoxy substrate 160, and a light receiving surface 161 at its bottom surface is exposed to a cavity 162 formed in the substrate 160. Then, the exposed light receiving surfaces 161 are provided with color filters F1, F2, and F3, respectively. Underneath the substrate 160 is fixed an optical guide 163. The optical guide 163 is provided with a blade 165 which reflects light in a perpendicular direction in a position opposite to the light receiving surface 161.

The photo-transistor PO has a light receiving sensitivity at a wavelength of 400 nm to 1200 nm, and becomes conductive upon receiving light having a wavelength within the above-mentioned range.

To the optical guide 163 is inputted a drive light L1 having a wavelength of $\lambda 1$, a drive light L2 having a wavelength of $\lambda 2$, and a drive light L3 having a wavelength of $\lambda 3$. The color filter F1 allows only the drive light L1 to pass, the color filter F2 allows only the drive light L2 to pass, and the color filter F3 allows only the drive light L3 to pass.

Figure 24:
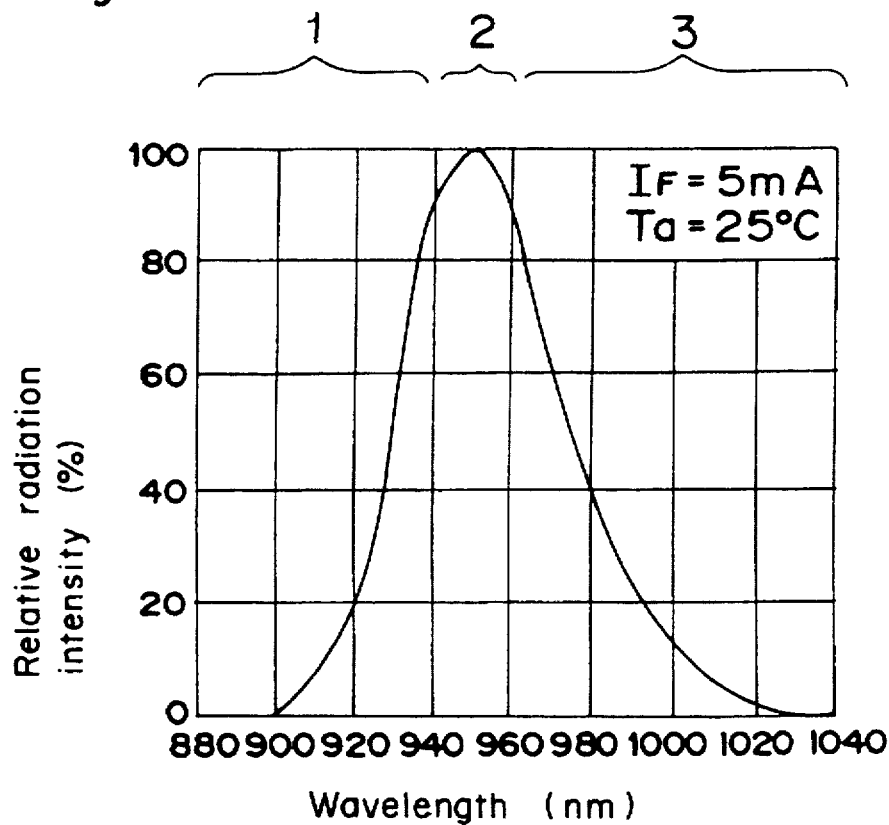
FIG. 24 is a graph showing a light emitting characteristic of a light emitting diode of the third embodiment.

AS shown in FIG. 25, the third embodiment has three gallium arsenide (GaAs) infra-red light emitting diodes D10, D20, and D30 for generating drive lights. Each of the GaAs infra-red light emitting diodes D10, D20, and D30 has a radiation peak wavelength of 950 nm as shown in FIG. 24. In front of the infra-red light emitting diode D10 is provided a filter F10 which allows light having a wavelength of 900 to 940 nm, i.e., only the drive light L1 to pass. In front of the infra-red light emitting diode D20 is provided a filter F20 which allows light having a wavelength of 940 to 960 nm, i.e., only the drive light L2 to pass. In front of the infra-red light emitting diode D30 is provided a filter F30 which allows light having a wavelength of 960 to 1040 nm, i.e., only the drive light L3 to pass. Therefore, the drive light L1 having the wavelength of λ1 in a wavelength band 1 as shown in FIG. 24 is outputted from the filter F10, the drive light L2 having the wavelength of λ2 in a wavelength band 2 as shown in FIG. 24 is outputted from the filter F20, and the drive light L3 having the wavelength of λ3 in a wavelength band 3 as shown in FIG. 24 is outputted from the filter F30.

According to the third embodiment, light emitted from the drive light generating infra-red light emitting diode D10 passes through the filter F10 to be the drive light L1, and travels through the optical guide 163. The drive light L1 is reflected on the blade 165, and then enters into the filters F1, F2, and F3. Then, only the drive light L1 which enters into the filter F1 is allowed to pass, and then enters into the photo-transistor PO to make the photo-transistor PO conductive. Then, the red light emitting diode D1 fixed on the photo-transistor PO emits light. Meanwhile, the drive light L1 which enters into the filters F2 and F3 are interrupted, and therefore the light does not enter into the photo-transistor PO. Therefore, the green light emitting diode D2 and the blue light emitting diode D3 do not emit light.

In the same manner as above, the drive light L2 which has passed through the filter F20 passes only the filter F2 among the filters F1 through F3 to make the photo-transistor PO conductive and make the green light emitting diode D2 emit light. Meanwhile, the drive light L3 which has passed through the filter F30 passes only the filter F3 among the filters F1 through F3 to make the photo-transistor PO conductive and make the blue light emitting diode D3 emit light.

Therefore, according to the third embodiment, a red light can be displayed when the light emitting diode D10 is made to light, a green light can be displayed when the light emitting diode D20 is made to light, and a blue light can be displayed when the light emitting diode D30 is made to light. Therefore, a color display can be achieved.

Furthermore, according to the third embodiment, the drive light L1 for emitting the red light, the drive light L2 for emitting the green light, and the drive light L3 for emitting the blue light can be transmitted through the optical guide 163. In other words, the drive lights L1 through L3 can be transmitted in a wavelength multiplexing manner, and therefore the drive light transmitting optical guide 163 has a simple structure.

Furthermore, the drive lights L1 through L3 are each provided by infra-red light, and the wavelength of the display light and the wavelength of the drive light are made different from each other. Therefore, even through the drive light leaks onto the display screen, the light is invisible. Furthermore, the light emitting diodes D10 through D30 for generating the drive lights are each allowed to be an infra-red light emitting diode, and therefore the drive lights can be supplied at a low cost.

Furthermore, according to the third embodiment, the filters F1 through F3 are formed on the light receiving surface 161 of the photo-transistor PO. Therefore, the filters F1 through F3 can be formed in a process for fabricating a wafer for producing the photo-transistor PO. Therefore, the filters F1 through F3 can be easily formed, thereby allowing the manufacturing cost to be reduced.

The drive lights L1 through L3 are formed by means of the filters F10 through F30 in a manner as shown in FIG. 25 in the third embodiment. However, the drive lights L1, L2, and L3 may be generated by means of three light emitting diodes having different wavelengths without using the filters F10 through F30. For instance, it is permissible to make a first light emitting diode have an emission light wavelength λp1=750 nm, make a second light emitting diode have an emission light wavelength λp2=850 nm, make a third light emitting diode have an emission light wavelength λp3=950 nm, and make the filters F1, F2, and F3 have transmission light wavelength bands of λp1±40 nm, λp2±40 nm, and λp3±40 nm, respectively. In the present case, there is no need to provide an optical filter between the optical guide and each light emitting diode.

Figure 22:
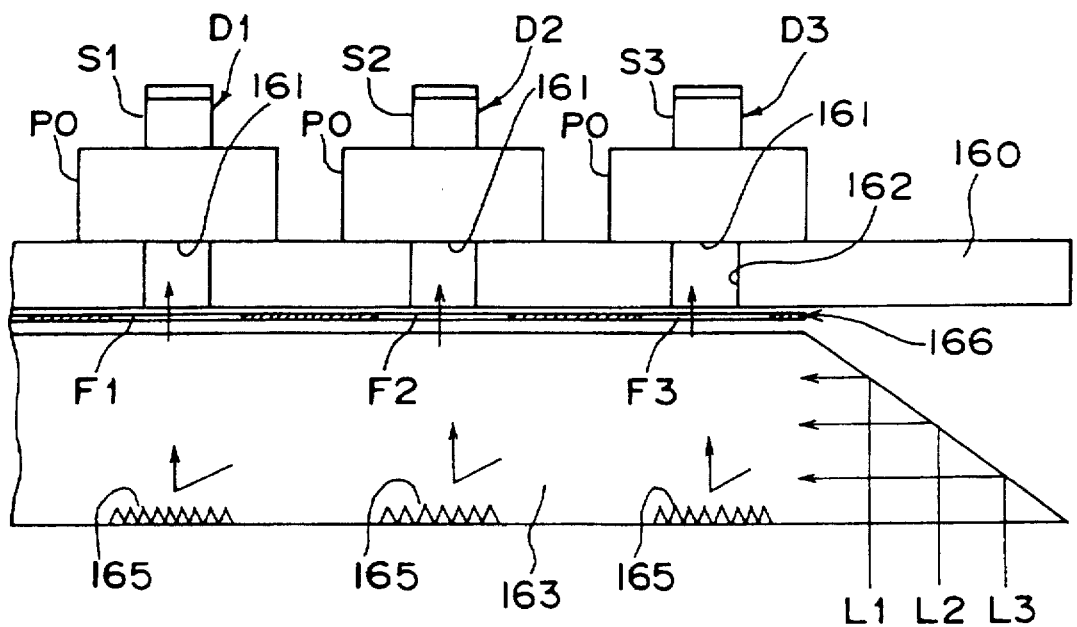
FIG. 22 is a sectional view of a part of a modification of the third embodiment.
Figure 23:
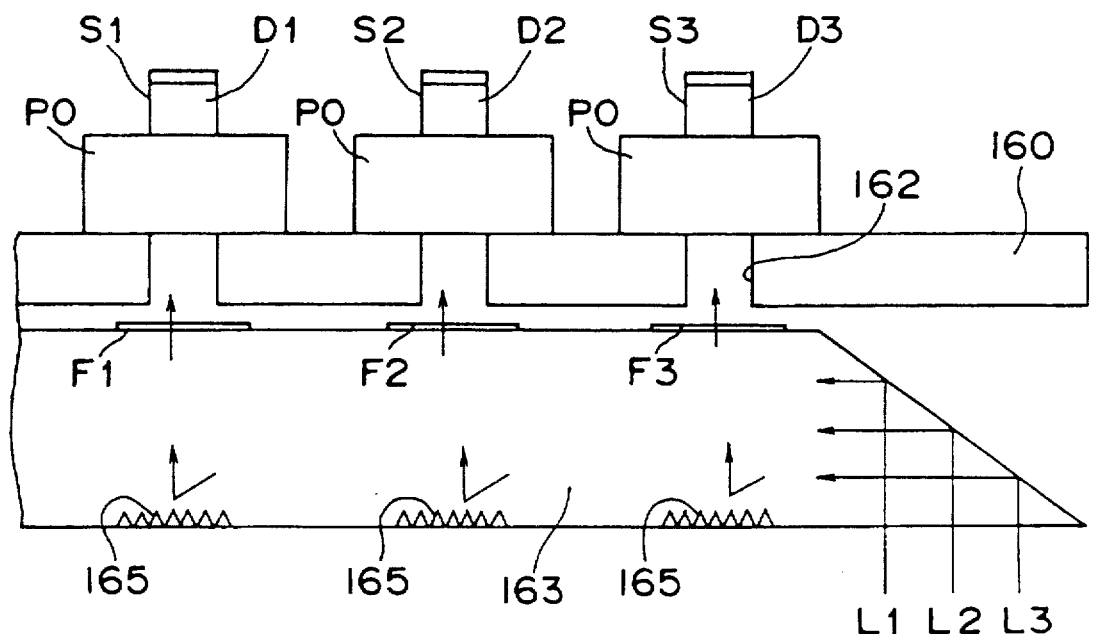
FIG. 23 is a sectional view of a part of another modification of the third embodiment.

Furthermore, the filters F1, F2, and F3 are mounted to the light receiving surfaces of the phototransistors PO, PO, and PO in the third embodiment. However, as shown in FIG. 22, a film 166 including the filters F1, F2, and F3 may be interposed between a glass epoxy substrate 160 and an optical guide 163. In another case, as shown in FIG. 23, the filters F1, F2, and F3 may be attached to an upper surface of the optical guide 163.

Furthermore, the possible erroneous operation due to external light can be reduced by providing the lens array 11 with a filter for absorbing or reflecting the drive light or by producing the lens array 11 with a material for absorbing or reflecting the drive light.

Figure 27:
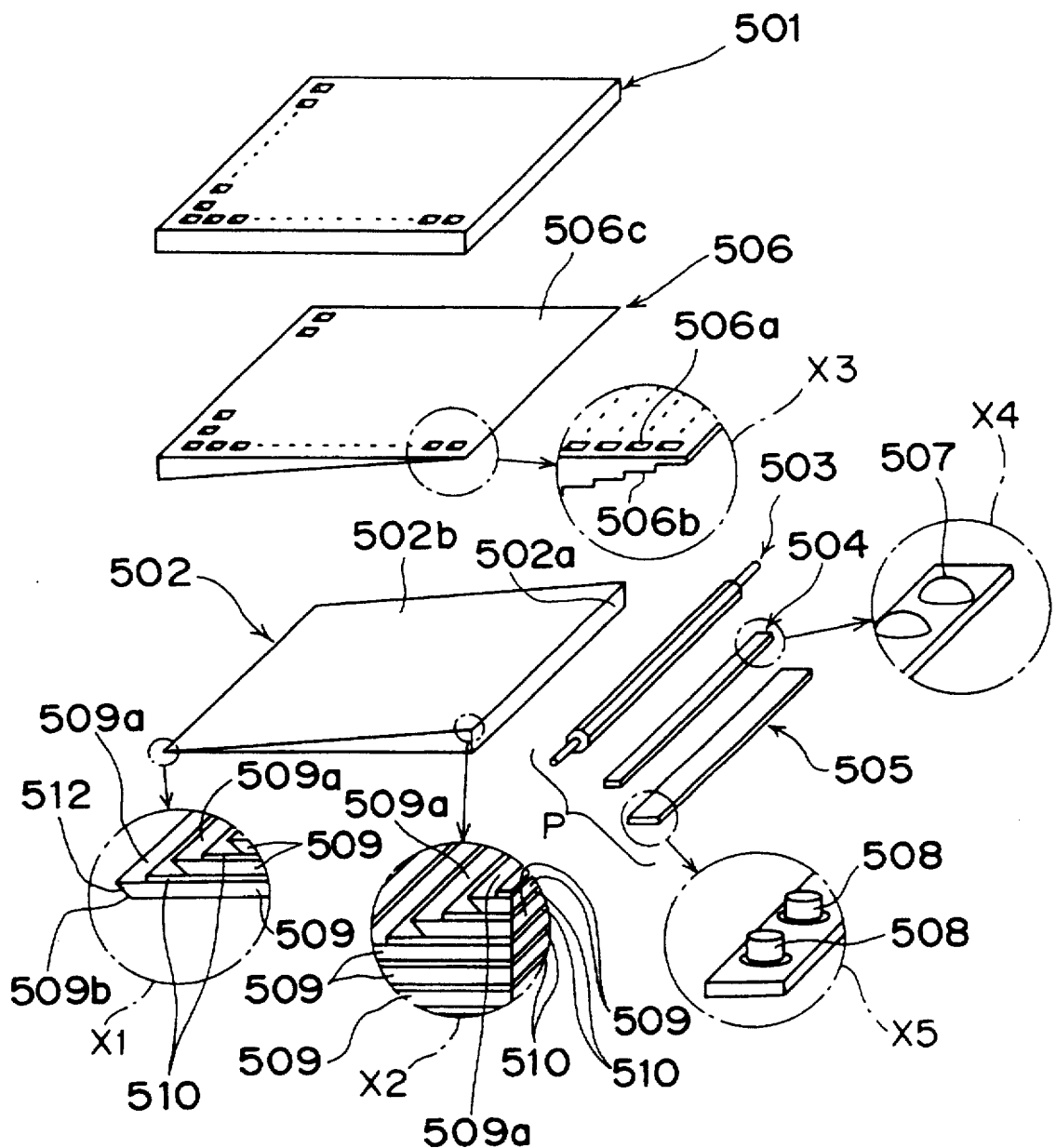
FIG. 27 is a perspective view showing the entire structure of a light emitting display device according to a fourth embodiment of the present invention.

FIG. 27 shows the structure of a light emitting display device according to a fourth embodiment of the present invention. The fourth embodiment comprises a dot matrix LED section 501 which serves as a semiconductor display section, an optical guide 502, a deflection mirror 503, a lens array 504, and a laser diode array 505 for transmission use. The deflection mirror 503, the lens array 504, and the laser diode array 505 constitute an optical control section. Between the dot matrix LED section 501 and the optical guide 502 is interposed a light interruption frame 506 which serves as a light interruption member.

Figure 29:
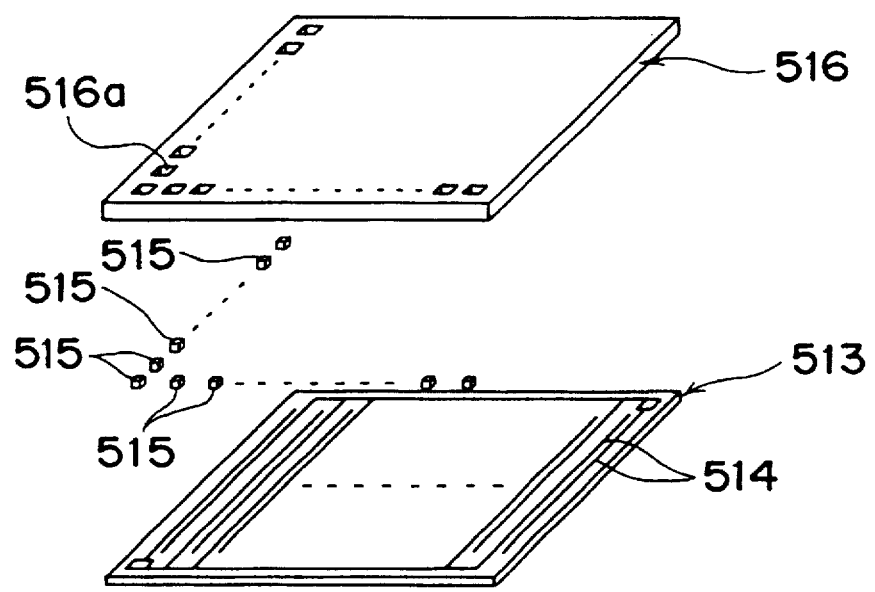
FIG. 29 is a perspective view showing the structure of a dot matrix LED section of the fourth embodiment.

As shown in FIG. 29, the dot matrix LED section 501 has a transparent printed circuit board 513, a plurality of semiconductor display elements 515, 515, . . . arranged in a matrix constituting rows and columns, and a frame board 516. The transparent printed circuit board 513 has a wiring section 514 for connecting the plural number of semiconductor display elements 515 to the power source. The frame board 516 is provided with a plurality of through holes 516a arranged in a matrix constituting rows and columns. In the present embodiment, the transparent printed circuit board 513 is made of polyimide, glass, or the like. The wiring section 514 is formed by plating a copper material with nickel and gold.

FIG. 30 is an enlarged sectional view of an essential part of the dot matrix LED section 501. As shown in FIG. 30, each semiconductor display element 515 is placed in each through hole 516a of the frame board 516. A lower electrode 515a of the semiconductor display element 515 is fixed to the wiring section 514 of the printed circuit board 513 as electrically connected to the wiring section. Further, an upper electrode 515b of the semiconductor display element 515 is connected to the wiring section 514 via a wire W. The semiconductor display element 515 is entirely sealed in a sealing resin 517 injected in the through hole 516a. The frame board 516 has a role of interrupting light between the semiconductor display elements 515, a role of protecting the wire W, and a role of defining a space for the seal with the sealing resin 517. In the present embodiment, the sealing resin 517 is formed of epoxy resin. In FIG. 30, an arrow PIN represents a travelling passage of the signal light entering into the semiconductor display element 515, while an arrow $P_{OUT}$ represents a travelling passage of the display light going out of the semiconductor display element 515.

Figure 28:
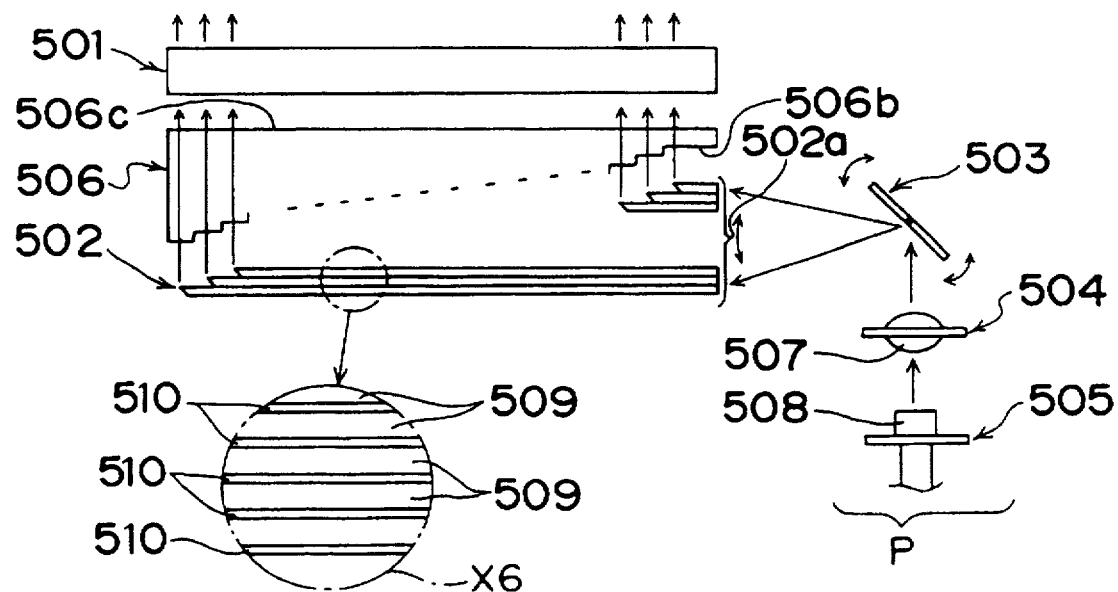
FIG. 28 is a side view showing the structure of the fourth embodiment.

Meanwhile, as shown in FIGS. 27 and 28, the optical guide 502 has a waveguide sheet 509 and a reflection film 510 which are stacked alternately one over the other in a laminate form. In the present embodiment, the waveguide sheet 509 is formed of polyimide, and the reflection film 510 is formed of aluminum. As shown in a partially enlarged view X1 of FIG. 27, the reflection film 510 stacked on the waveguide sheet 509 in contact with each other is made shorter than the waveguide sheet 509, thereby exposing an upper end portion 509a of the waveguide sheet 509. The exposed upper end portion 509a is made to face one column of the semiconductor display elements 515 of the dot matrix LED section 501. In other words, each waveguide sheet 509 is provided in correspondence with each line of the dot matrix LED section 501. In the waveguide sheet 509, an end surface 509b adjacent to the upper end portion 509a is inclined, thereby making an acute angle between the upper end portion 509a and the end surface 509b. In other words, the end surface 509b is an inclined surface 512. As shown in FIG. 28, a signal light which has travelled through each waveguide sheet 509 is reflected on the inclined end surface 509b to go out of the upper end portion 509a, and then made to travel toward the semiconductor display elements 515 which constitute a specified column. As shown in FIGS. 27 and 28, a light outlet surface 502b of the optical guide 502 has a stairs-like shape as a whole.

On the other hand, as shown in a partially enlarged view X5 of FIG. 27, the laser diode array 505 has a plurality of transmission laser diodes 508, 508, . . . constituting an array corresponding to one column of the semiconductor display elements 515. As shown in a partially enlarged view X4 of FIG. 27, the lens array 504 has a plurality of light converging lenses 507, 507, . . . corresponding to the transmission laser diodes 508, 508, . . . . The deflection mirror 503 is composed of a galvano-mirror or a polygon mirror. Each of the laser diodes 508 is an infra-red light emitting diode which emits infra-red light.

As shown in FIG. 28, the laser diode array 505 generates a signal light for line-sequentially driving the plural number of semiconductor display elements 515, and the lens array 504 converges the signal light. Then, the deflection mirror 503 deflects the signal light to make the signal light enter into a light inlet surface 502a so as to vertically scan the light inlet surface 502a of the optical guide 502.

Meanwhile, as shown in FIG. 27, the light interruption frame 506 has a plurality of through holes 506a, 506a, . . . which serve as a plurality of passages while being arranged in a matrix in correspondence with the rows and columns of the semiconductor display elements 515 of the dot matrix LED section 501. Meanwhile, one column of the through holes 506a corresponds to the upper end portion 509a of one waveguide sheet 509 of the optical guide 502. Then, as shown in a partially enlarged view X3 of FIG. 27 and FIG. 28, an opposite surface 506b of the light interruption frame 506 arranged opposite to the light outlet surface 502b of the optical guide 502 has a stairs-like shape such that the opposite surface 506b can closely fit to the light outlet surface 502b.

As shown in FIG. 31A, each of the semiconductor display elements 515 has a photo-transistor PO and a light emitting diode L1. The photo-transistor PO includes an n-GaAs substrate 520B, an n-GaAs layer 522A, a p-GaAs layer 521, and an n-GaAs layer 522B in a stack. The light emitting diode L1 includes an n-GaAs substrate 520A, an n-GaAlAs layer 519, and a p-GaAlAs layer 518 in a stack. The n-GaAs layer 522B of the photo-transistor PO and the n-GaAs substrate 520A of the light emitting diode L1 are electrically connected with each other by means of a solder bump 525. The solder bump 525 is a partial electrode which partially covers only a peripheral area of a lower surface 520A-1 of the n-GaAs substrate 520A.

Meanwhile, the uppermost p-GaAlAs layer 518 of the light emitting diode L1 is connected to a p-side electrode 523, and the p-side electrode 523 is connected to the power source. The p-side electrode 523 is a partial electrode which covers only a center area of an upper surface (i.e., a display light emitting surface) 518a of the p-GaAlAs layer 518.

Meanwhile, the lowermost n-GaAs substrate 520B of the photo-transistor PO is connected to an n-side electrode 524, and the n-side electrode 524 is connected to the wiring section 514. The n-side electrode 524 is a partial electrode which covers only a peripheral area of a lower surface 520B-1 of the n-GaAs substrate 520B.

In other words, the photo-transistor PO and the light emitting diode L1 are electrically connected in series with each other. When the photo-transistor PO becomes conductive, an electric power is supplied from the power source to the light emitting diode L1 to make the light emitting diode emit light.

The solder bump 525 is properly formed of a conductive paste or silver paste. The p-side electrode 523 is properly formed of AuZn. The n-side electrode 524 is properly formed of AuGe.

Figure 32:
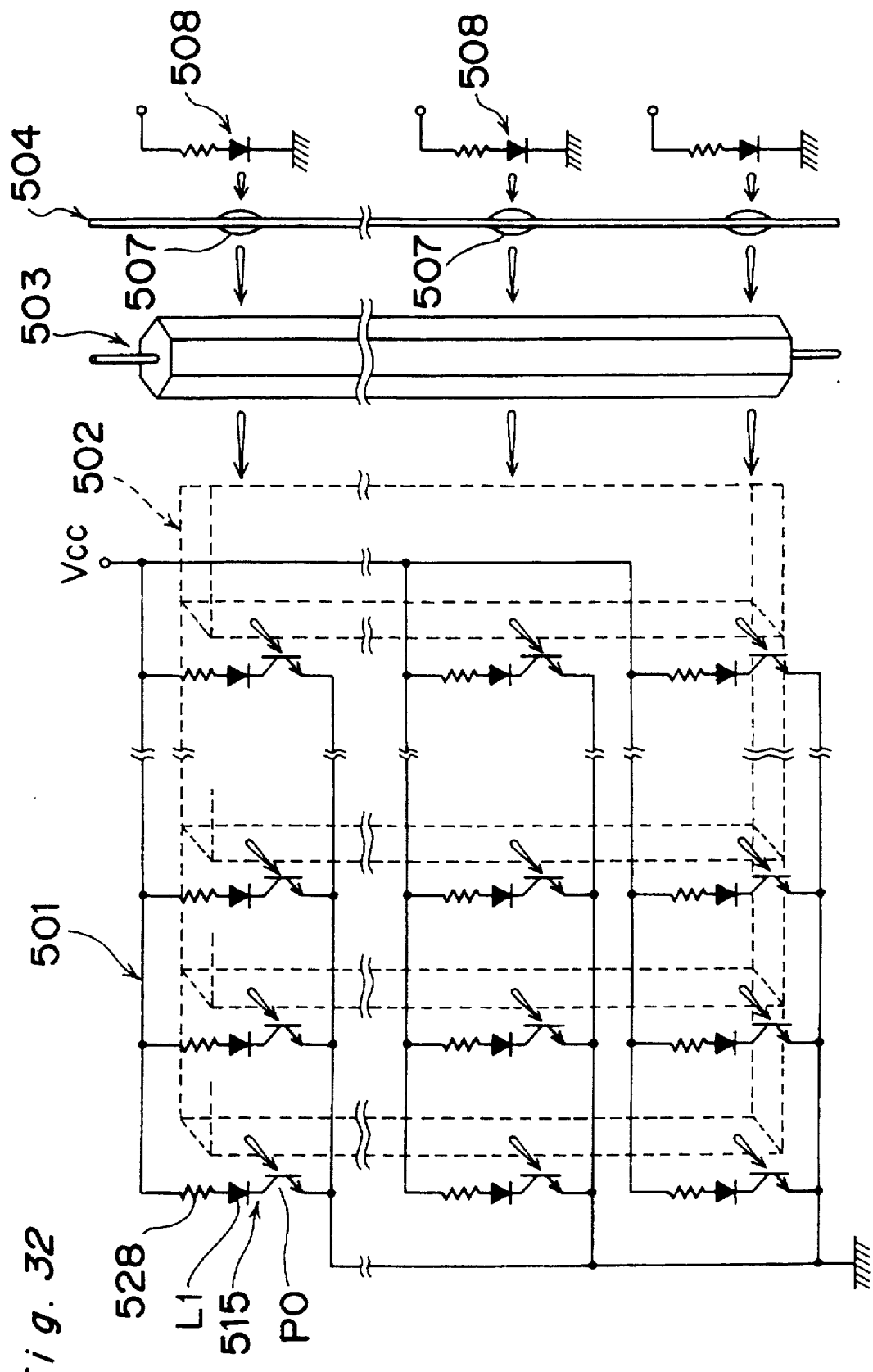
FIG. 32 is a circuit diagram showing an electric circuit of the fourth embodiment.
Figure 33:
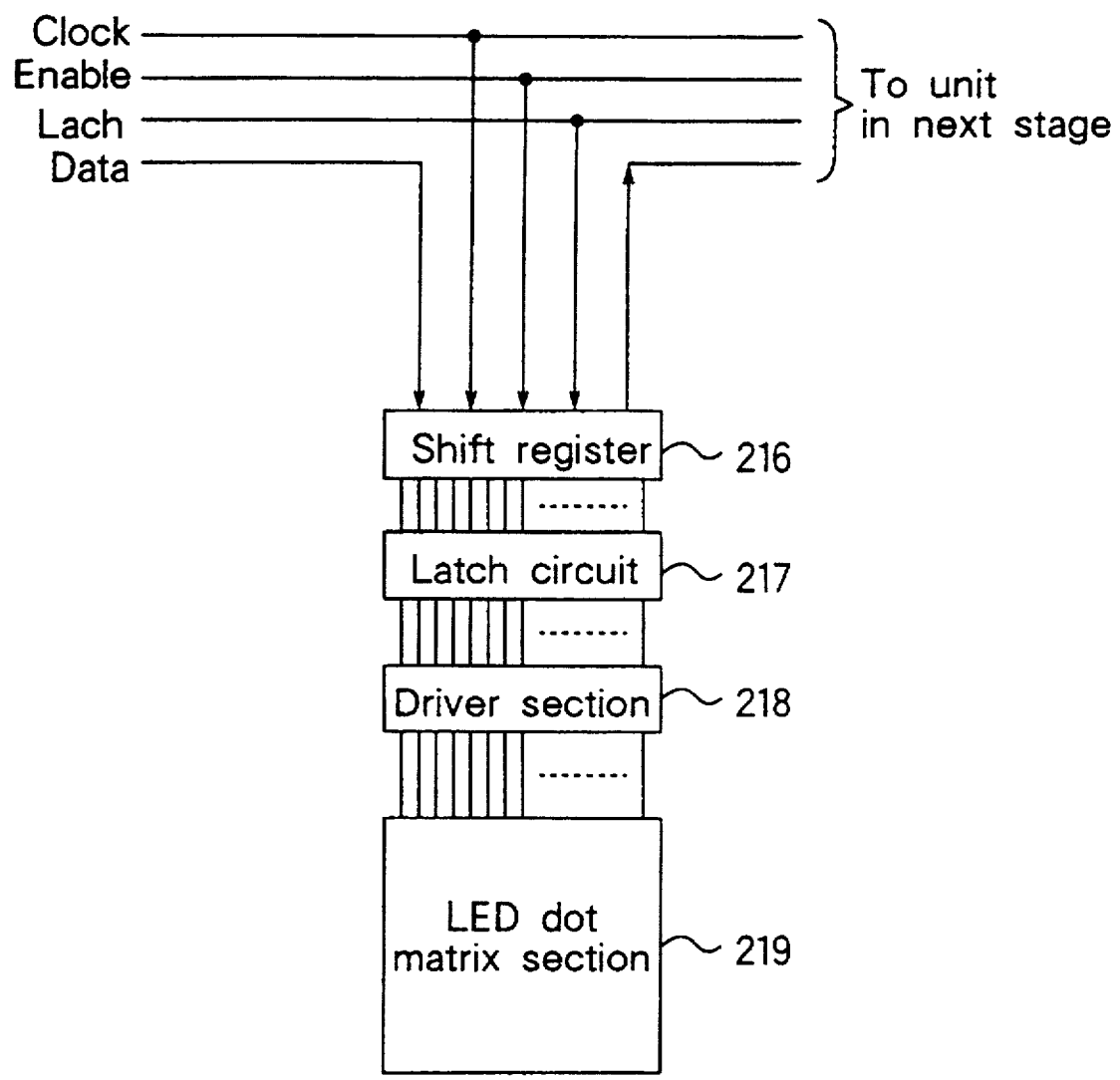
FIG. 33 is a block diagram of a conventional static drive type light emitting display device.
Figure 34:
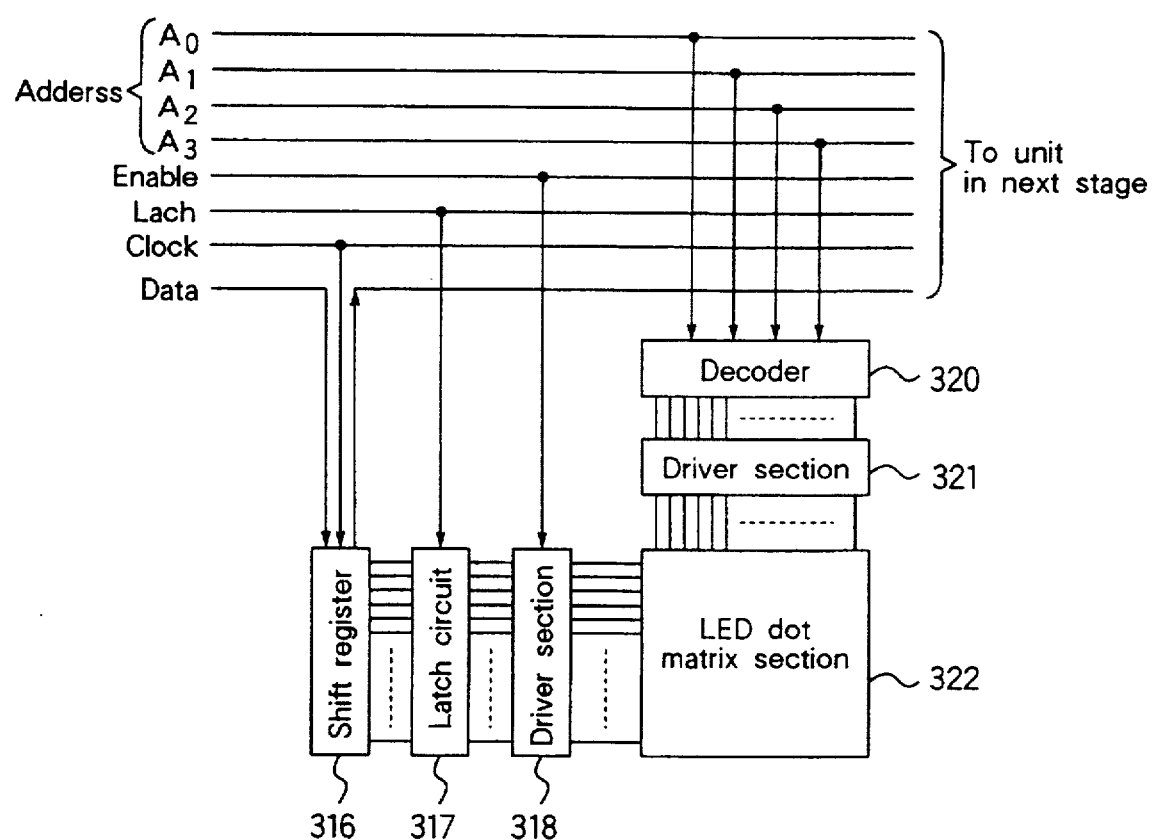
FIG. 34 is a block diagram of a conventional dynamic drive type light emitting display device.
Figure 35:
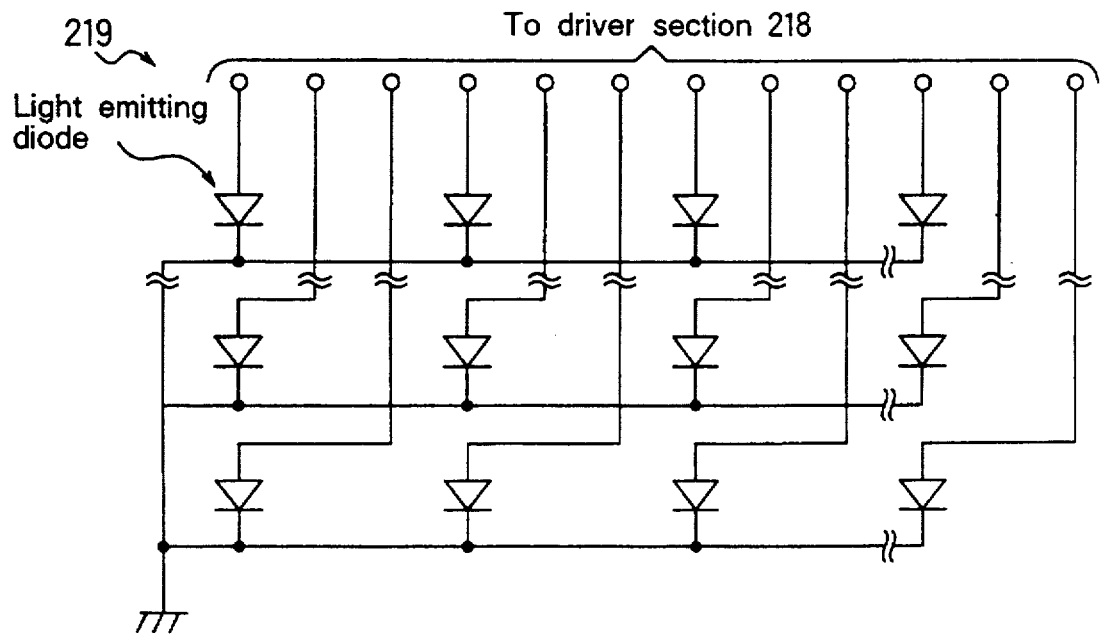
FIG. 35 is a circuit diagram of a display section of a conventional example of the static drive type.
Figure 36:
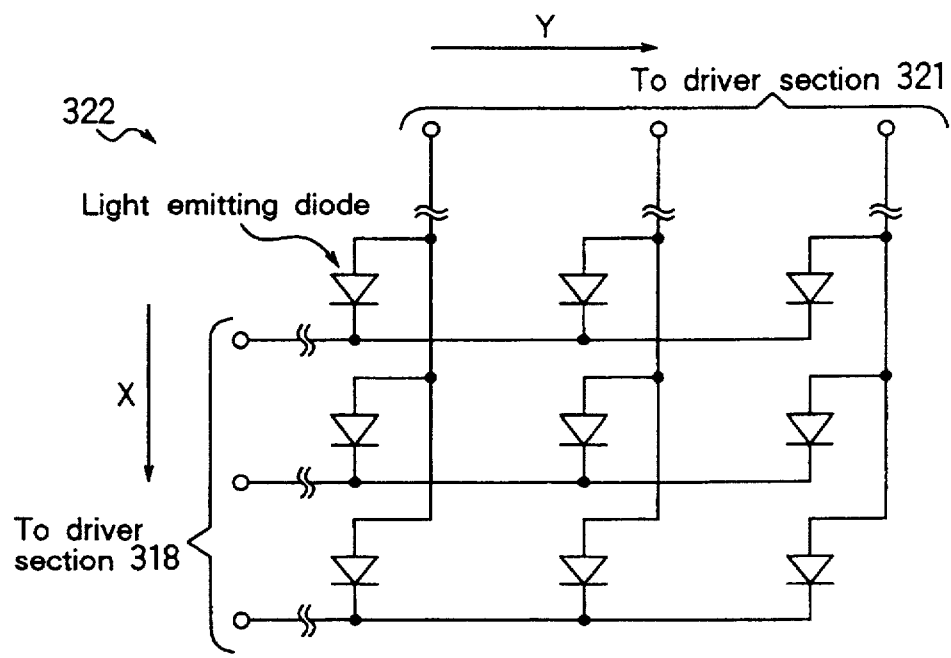
FIG. 36 is a circuit diagram of a display section of a conventional example of the dynamic drive type.

Furthermore, as shown in FIGS. 29 and 32, a plurality of semiconductor display elements 515 each constituted by a series circuit composed of a load resistor 528, the photo-transistor PO, and the light emitting diode L1 are connected in parallel with each other to constitute one row. A plurality of rows respectively composed of the semiconductor display elements 515 are connected in parallel with each other while being connected to a power source Vcc. As is apparent from FIG. 32, when the signal light enters into the photo-transistor PO to make the photo-transistor PO conductive, an electric power is supplied from the power source Vcc to the light emitting diode L1.

Then, an operation of the light emitting display device having the above-mentioned construction will be described below. In the light emitting display device, firstly the transmission laser diode array 505 constituting the aforementioned optical control section drives a laser diode driver (not shown) by means of a latch circuit (not shown) upon taking in a signal of one line. Then, the plural number of transmission laser diodes 508 generates a signal light for line-sequentially driving the semiconductor display elements 515.

The above-mentioned signal light is converged by each convergence lens 507 of the lens array 504. Further, the signal light is deflected by the deflection mirror 503 to vertically scan the light inlet surface 502a of the optical guide 502. The direction of the deflection mirror 503 is controlled by being driven to rotate by a specified quantity about its center axis in synchronization with the emission of light from the transmission laser diodes 508. The thus scanned signal light travels through the waveguide sheets 509, 509, . . . of the optical guide 502, and then reflected on the inclined surface 512 of each waveguide sheet 509 to go out of the upper surface end portion 509a. The outgoing signal light passes through each through hole 506a of the light interruption frame 506, and then enters into each semiconductor display element 515 of the dot matrix LED section 501. The thus entering signal light makes the phototransistor PO of the semiconductor display element 515 conductive. Then, as is apparent from the electric circuit of the present embodiment shown in FIG. 32, an electric power is supplied from the power source to the light emitting diode L1 connected in series with the photo-transistor PO. Eventually, the light emitting diode L1 emits light. After the optical control section P has completely transmitted the signal light for all the lines and the dot matrix LED section 501 has completely displayed a signal of one screen, the power source which is supplying the electric power to the dot matrix LED section 501 is turned off, and the dot matrix LED section 501 is reset. Then, the operation enters into a stage of displaying the next screen in the same manner as described above.

As shown in FIG. 31A, when one screen is being displayed, light which serves as a display light is emitted from the display light emitting surface 518a, and light which serves as a signal light is emitted from the lower surface 520A-1. Therefore, the photo-transistor PO is made conductive by the signal light emitted from the lower surface 520A-1. With the above-mentioned arrangement, the photo-transistor PO is made to continue its conductive state by the light emitted from the light emitting diode L1 itself even after the signal light from the optical guide 502 ceases. In other words, the semiconductor display element 515 has a self-holding function. Therefore, the light emitting time can be increased more than in the case where the semiconductor display element has no self-holding function. Therefore, the display brightness can be increased.

Furthermore, the semiconductor display element 515 is made to light not by any electric signal but by the signal light which has been outputted from the optical control section P and guided through the optical guide 502. With the above-mentioned arrangement, there is required no electric wiring for conducting the data signal and the scanning signal for driving use in contrast to the conventional case. Therefore, the necessitated electric wiring to the semiconductor display element 515 is allowed to be only the electric wiring for supplying the electric power, thereby allowing the electric wiring structure to be simpler than that of the conventional case.

Therefore, according to the fourth embodiment, an inexpensive light emitting display device which has a simple wiring structure and a bright display can be provided.

Furthermore, since the waveguide sheet 509 and the reflection film 510 are alternately stacked one over the other in a laminate form in the optical guide 502, the signal light travelling through the waveguide sheet 509 can propagate while repeating reflection between the reflection films 510 and 510 arranged on the upper and lower surfaces of the waveguide sheet 509. Therefore, according to the present optical guide 502, the signal light from the optical control section P can be efficiently transmitted to the dot matrix LED section 501.

Furthermore, the transmission laser diodes 508 of the optical control section P emit infra-red light, and therefore it is infra-red light that propagates through the optical guide 502. Therefore, even when the signal light, i.e., the infra-red light is mixed with the display light emitted from the light emitting diode L1, the display at the dot matrix LED section 501 which serves as the display section is not disturbed. Therefore, a correct display can be achieved. Furthermore, the laser diode which emits infra-red light is less expensive than any other type laser diode, and therefore the cost of the laser diode array 505 for the driving use can be reduced.

Furthermore, the light interruption frame 506 is provided between the dot matrix LED section 501 and the optical guide 502, and therefore external light can be interrupted by the light interruption frame 506. With the above-mentioned arrangement, the external light can be prevented from entering into the dot matrix LED section 501, and the possible occurrence of a cross-talk due to leak of the signal light from the optical guide section to other adjacent semiconductor display elements can be prevented. Therefore, a correct display can be achieved.

Furthermore, as shown in FIGS. 29 and 30, the light interruption frame board 516 is provided on the transparent substrate 513 in the dot matrix LED section 501, and therefore the display light from the semiconductor display elements 515 can be prevented from leaking to any other adjacent element.

Furthermore, the opposite surface 506b of the light interruption frame 506 opposite to the light outlet surface 502b of the optical guide 502 has a stairs-like shape such that it can closely fit to the light outlet surface 502b. Therefore, when the optical guide 502 and the light interruption frame 506 are coupled with each other such that the light outlet surface 502b and opposite surface 506b are superposed on each other, the stairs-like shapes of them closely fit to each other. With the abovementioned arrangement, the upper surface 506c of the light interruption frame 506 and the lower surface 502c of the optical guide 502 can be put in parallel with each other in a stable state. Therefore, a mechanically robust structure can be provided in an easy assembling manner.

The fourth embodiment uses a series circuit composed of the photo-transistor PO and the light emitting diode L1 as the semiconductor display element. Therefore, the photo-transistor PO and the light emitting diode L1 may be made of different materials. The above-mentioned arrangement allows the design for constituting the above-mentioned semiconductor display element to be easy, and allows the cost of the semiconductor display element to be reduced.

Although the fourth embodiment uses a series circuit composed of the photo-transistor PO and the light emitting diode L1 as the semiconductor display element, a light activated thyristor having a p-n-p-n structure as shown in FIG. 31B may be used as the semiconductor display element. The light activated thyristor includes an n-GaAs substrate 560, an n-GaAlAs layer 559A, a p-GaAlAs layer 558A, an n-GaAlAs layer 559B, and a p-GaAlAs layer 558B in a stack. On an upper surface (light emitting surface) 558B-1 of the p-GaAlAs layer 558B is formed a p-side electrode 563. The p-side electrode 563 is a partial electrode which partially covers a center portion of the upper surface 558B-1. Meanwhile, on a lower surface 560-1 of the n-GaAs substrate 560 is formed an n-side electrode 564 which serves as a partial electrode for partially covering the lower surface 560-1. The above-mentioned light activated thyristor is an electric element equivalent to the series circuit composed of the light emitting diode and the photo-transistor. Therefore, a simple physical structure and a simple circuit structure are achieved with an improved reliability in a simple manufacturing process, thereby reducing the cost.

Although there is used a semiconductor having GaAs and GaAlAs as a semiconductor constituting the semiconductor display element in each of the aforementioned embodiments, a semiconductor having GaP and Si may be used as a semiconductor constituting the semiconductor display element.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting display device comprising:

a light emitting element;

a light receiving element which is electrically connected in series with the light emitting element so that the light emitting element is driven to emit light when the light receiving element becomes conductive, and is arranged so that the light receiving element can be made conductive upon receiving light emitted from the light emitting element on a light receiving surface of the light receiving element; and an optical passage which guides both drive lights of a data light representing data and a scanning light to the light receiving element to make the light receiving element conductive wherein the light receiving element becomes conductive when receiving both the data light and the scanning light.

2. A light emitting display device as claimed in claim 1, further comprising:

drive light output means for outputting the drive lights, the drive light output means outputting a drive light having a wavelength different from a wavelength of display light emitted from the light emitting element.

3. A light emitting display device as claimed in claim 2, wherein each of the drive lights is infra-red light.

4. A light emitting display device as claimed in claim 1, wherein the light receiving element has a mask for interrupting external light directed to the light receiving surface.

5. A light emitting display device as claimed in claim 4, wherein the mask constitutes an electrode of the light receiving element.

6. A light emitting display device as claimed in claim 1, further comprising:

a filter for removing a drive light for making the light receiving element conductive from external light directed to the light receiving element.

7. A light emitting display device as claimed in claim 1, wherein the optical passage is a grating-shaped optical guide which has a data optical passage for guiding the data light and a scanning optical passage for guiding the scanning light, said data optical passage and said scanning optical passage crossing each other in an identical plane.

8. A light emitting display device as claimed in claim 7, wherein the grating-shaped optical guide has a quadrangular pyramid-shaped optical reflector which is arranged at an intersection of the grating-shaped optical guide, and operates to reflect the data light and the scanning light in a direction perpendicular to a plane along the optical guide to direct the lights to the light receiving surface of the light receiving element.

9. A light emitting display device as claimed in claim 1, wherein the optical passage has a data optical passage for guiding the data light and a scanning optical passage for guiding the scanning light, and one of the data optical passage and the scanning optical passage has an extension which extends from a portion adjacent to an intersection of the data optical passage and the scanning optical passage to a proximity of the other of the data optical passage and the scanning optical passage.

10. A light emitting display device as claimed in claim 9, wherein the data optical passage is provided with a trigonal prism-shaped reflector which is arranged at a portion adjacent to the intersection, and has an inclined reflection surface for reflecting the data light in a direction perpendicular to the data optical passage and the scanning optical passage, and the scanning optical passage is provided with a trigonal prism-shaped reflector which is arranged at a portion adjacent to the intersection, and has an inclined reflection surface for reflecting the scanning light in a direction perpendicular to the data optical passage and the scanning optical passage.

11. A light emitting display device as claimed in claim 1, wherein a plurality of display elements are respectively comprised of the light emitting element and the light receiving element, a display section is constituted by arranging the plurality of display elements in a matrix comprised of rows and columns, and further comprising an optical control section having a laser diode array which generates a signal light for line-sequentially driving the plural number of display elements, a lens array which converges the signal light from the laser diode array, and a mirror for deflecting the signal light from the lens array, whereby the optical passage guides the signal light from the mirror of the optical control section to the light receiving element of the display section.

12. A light emitting display device as claimed in claim 11, wherein the light emitting element is comprised of a light emitting diode, and the light receiving element is comprised of a photo-transistor.

13. A light emitting display device as claimed in claim 11, wherein the display element is comprised of a light activated thyristor.

14. A light emitting display device as claimed in claim 11, wherein the optical passage has a structure in which a waveguide sheet for transmitting the signal light from the optical control section and a reflection film for reflecting the signal light are alternately stacked one over the other in a laminate form.

15. A light emitting display device as claimed in claim 14, wherein the optical passage comprises a light outlet portion including an inclined surface which reflects the signal light from the optical control section and guides the signal light to the display element.

16. A light emitting display device as claimed in claim 11, wherein the laser diode array of the optical control section is comprised of a laser diode which emits infra-red light.

17. A light emitting display device as claimed in claim 11, wherein a light interruption member including a passage portion which allows the signal light from the optical passage to pass toward the light receiving element of the display section, and an interrupting portion which prevents external light coming from outside the optical passage from travelling toward the light receiving element, and prevents the signal light coming from the optical passage from entering into any other adjacent display element is provided between the optical passage and the display section.

18. A light emitting display device as claimed in claim 11, wherein the display section comprises: a plurality of display elements arranged in a matrix comprised of rows and columns; a transparent wiring board which transmits the signal light from the optical passage, and a light interruption frame board which prevents light from leaking to any element adjacent to the display element so as to prevent a cross-talk from occurring.

19. A light emitting display device comprising:

a light receiving element; and a light emitting element which is mounted on a part of the light receiving element, and is electrically connected in series with the light receiving element and has a bottom surface fixed to the part of the light receiving element, wherein light emitted from a side surface of the light emitting element enters into an upper surface of another part of the light receiving element which is not facing the bottom surface of the light emitting element and is a light receiving surface to make the light receiving element conductive.

20. A light emitting display device comprising:

a light receiving element;

a light emitting element which is electrically connected in series with the light receiving element and has a bottom surface fixed to the light receiving element, wherein light emitted from a side surface of the light emitting element enters into a light receiving surface which is not facing the bottom surface of the light emitting element and is a part of an upper surface of the light receiving element to make the light receiving element conductive; and an optical passage which has a body below the light receiving element and an extension which extends upward from the body and is arranged adjacent to the light receiving element, and reflects a drive light which travels upward through the extension at an upper end of the extension to make the drive light enter into the light receiving surface of the light receiving element.

21. A light emitting display device comprising:

a plurality of light emitting elements which output lights having different wavelengths;

a light receiving element which is connected in series with each of the plural number of light emitting elements, and becomes conductive upon receiving light having a wavelength corresponding to each color of the lights emitted from the light emitting elements;

an optical passage which transmits both of each of data lights representing data of the plural number of wavelengths corresponding to the plural number of different colors of lights and a scanning light, and guides both the lights to the light receiving element; and a color filter which is provided between the optical passage and the light receiving element, and allows only light for making of the light receiving element conductive to pass through the color filter.

22. A light emitting display device comprising:

a light emitting element;

a light receiving element which is electrically connected in series with the light emitting element so that the light receiving element drives the light emitting element to make the light emitting element emit light when the light receiving element becomes conductive, and is arranged so that the light receiving element becomes conductive upon receiving light emitted from the light emitting element, and which becomes conductive upon receiving both drive signals of a data signal and a scanning signal;

an optical passage which guides a light signal representing one of the data signal and the scanning signal; and an electric passage which conducts an electric signal representing the other of the data signal and the scanning signal to the light receiving element.

23. A light emitting display device comprising:

a semiconductor display section wherein a plurality of semiconductor display elements each comprised of a semiconductor light emitting element and a semiconductor light receiving element which is electrically connected in series with the semiconductor light emitting element so that the semiconductor light receiving element drives the semiconductor light emitting element when the semiconductor light receiving element becomes conductive and is arranged so that the semiconductor light receiving element becomes conductive upon receiving light from the semiconductor light emitting element are arranged in a matrix comprised of rows and columns;

an optical control section having a laser diode array which generates a signal light for line-sequentially driving the plural number of semiconductor display elements, a lens array which converges the signal light from the laser diode array, and a mirror for deflecting the signal light from the lens array; and an optical guide section which guides the signal light from the mirror of the optical control section to the semiconductor light receiving element of the semiconductor display section.

24. A light emitting display device as claimed in claim 23, wherein the semiconductor light emitting element is comprised of a light emitting diode, and the semiconductor light receiving element is comprised of a photo-transistor.

25. A light emitting display device as claimed in claim 23, wherein the semiconductor display element is comprised of a light activated thyristor.

26. A light emitting display device as claimed in claim 23, wherein the optical guide section has a structure in which a waveguide sheet for transmitting the signal light from the optical control section and a reflection film for reflecting the signal light are alternately stacked one over the other in a laminate form.

27. A light emitting display device as claimed in claim 26, wherein the optical guide section has a light outlet portion including an inclined surface which reflects the signal light from the optical control section and guides the signal light to the semiconductor display element.

28. A light emitting display device as claimed in claim 23, wherein the laser diode array of the optical control section is comprised of a laser diode which emits infra-red light.

29. A light emitting display device as claimed in claim 23, wherein a light interruption member including a passage portion which allows the signal light from the optical guide section to pass toward the semiconductor light receiving element of the semiconductor display section, and an interrupting portion which prevents external light coming from outside the optical guide section from travelling toward the semiconductor light receiving element, and prevents the signal light coming from the optical guide section from entering into any other adjacent semiconductor display element is provided between the optical guide section and the semiconductor display section.

30. A light emitting display device as claimed in claim 23, wherein the semiconductor display section comprises: a plurality of semiconductor display elements arranged in a matrix comprised of rows and columns; a transparent wiring board which transmits the signal light from the optical guide section, and a light interruption frame board which prevents light from leaking to any element adjacent to the semiconductor display element so as to prevent a cross-talk from occurring.

* * * * *